US010374090B2

(12) United States Patent
Ontalus

(10) Patent No.: US 10,374,090 B2
(45) Date of Patent: Aug. 6, 2019

(54) REPLACEMENT BODY FINFET FOR IMPROVED JUNCTION PROFILE WITH GATE SELF-ALIGNED JUNCTIONS

(71) Applicant: GLOBALFOUNDRIES INC., Grand Cayman (KY)

(72) Inventor: Viorel Ontalus, Unionville, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 2 days.

(21) Appl. No.: 15/675,970

(22) Filed: Aug. 14, 2017

(65) Prior Publication Data

US 2017/0345934 A1 Nov. 30, 2017

Related U.S. Application Data

(62) Division of application No. 14/954,166, filed on Nov. 30, 2015, now Pat. No. 9,761,720.

(51) Int. Cl.
*H01L 29/76* (2006.01)
*H01L 29/78* (2006.01)
(Continued)

(52) U.S. Cl.
CPC .... *H01L 29/785* (2013.01); *H01L 21/823821* (2013.01); *H01L 21/845* (2013.01); *H01L 29/0847* (2013.01); *H01L 29/0886* (2013.01); *H01L 29/1054* (2013.01); *H01L 29/41783* (2013.01); *H01L 29/41791* (2013.01);
(Continued)

(58) Field of Classification Search
CPC ............. H01L 29/7848; H01L 29/1054; H01L 29/785; H01L 29/6681; H01L 29/7851; H01L 29/66795; H01L 29/66545; H01L 29/0847; H01L 27/0886; H01L 21/845;
(Continued)

(56) References Cited

U.S. PATENT DOCUMENTS 6,852,603 B2 2/2005 Chakravarthi et al.
6,887,762 B1 5/2005 Murthy et al.
(Continued)

FOREIGN PATENT DOCUMENTS

TW   201027749 A   7/2010
TW   201535730 A   9/2015
TW   201535744 A   9/2015

*Primary Examiner* — Shouxiang Hu
(74) *Attorney, Agent, or Firm* — David Cain; Hoffman Warnick LLC

(57) ABSTRACT

After forming an epitaxial semiconductor layer on portions of a semiconductor located on opposite sides of a sacrificial gate structure, dopants from the epitaxial semiconductor layer are diffused into the semiconductor fin to form a dopant-containing semiconductor fin. A sacrificial gate stack is removed to provide a gate cavity that exposes a portion of the dopant-containing semiconductor fin. The exposed portion of the dopant-containing semiconductor fin is removed to provide an opening underneath the gate cavity. A channel which is undoped or less doped than remaining portions of the dopant-containing semiconductor fin is epitaxially grown at least from the sidewalls of the remaining portions of the dopant-containing semiconductor fin. Abrupt junctions are thus formed between the channel region and the remaining portions of the dopant-containing semiconductor fin.

20 Claims, 19 Drawing Sheets

(51) Int. Cl.
  *H01L 29/08* (2006.01)
  *H01L 29/66* (2006.01)
  *H01L 29/417* (2006.01)
  *H01L 21/84* (2006.01)
  *H01L 21/8238* (2006.01)
  *H01L 29/10* (2006.01)

(52) U.S. Cl.
  CPC .... *H01L 29/6681* (2013.01); *H01L 29/66545* (2013.01); *H01L 29/66795* (2013.01); *H01L 29/7848* (2013.01); *H01L 29/7851* (2013.01)

(58) Field of Classification Search
  CPC ....... H01L 29/41791; H01L 21/823821; H01L 29/41783
  See application file for complete search history.

(56) References Cited

U.S. PATENT DOCUMENTS

| | | | |
|---|---|---|---|
| 7,304,336 | B2 | 12/2007 | Cheng et al. |
| 7,485,536 | B2 | 2/2009 | Jin et al. |
| 8,367,498 | B2 * | 2/2013 | Chang ................. H01L 29/7848 438/268 |
| 8,815,670 | B2 | 8/2014 | Basker et al. |
| 10,068,963 | B2 * | 9/2018 | Chiang ............... H01L 29/0615 |
| 2006/0063334 | A1 | 3/2006 | Donze et al. |
| 2006/0172497 | A1 | 8/2006 | Hareland et al. |
| 2007/0155142 | A1 | 7/2007 | Jin et al. |
| 2009/0072317 | A1 | 3/2009 | Furukawa et al. |
| 2014/0191319 | A1 | 7/2014 | Cheng et al. |
| 2014/0239395 | A1 | 8/2014 | Basker et al. |
| 2014/0239399 | A1 | 8/2014 | Nagumo |
| 2015/0194523 | A1 * | 7/2015 | Kim .................... H01L 29/7848 257/192 |
| 2017/0239638 | A1 | 8/2017 | Merkel et al. |

* cited by examiner

US 10,374,090 B2

REPLACEMENT BODY FINFET FOR IMPROVED JUNCTION PROFILE WITH GATE SELF-ALIGNED JUNCTIONS

BACKGROUND

The present application relates to semiconductor device fabrication, and more particularly, to fabrication of fin field effect transistors (FinFETs) having abrupt junctions self-aligned to a gate electrode.

FinFETs are a desired device architecture due to their fast switching times and high current densities. In its basic form, a FinFET includes a source region, a drain region and a fin-shaped channel region located between the source and the drain regions. A gate electrode formed over the fin regulates electron or holes flow between the source and the drain regions. A gate spacer is typically formed on sidewalls of the gate electrode to control gate-to-source/drain spacing.

As dimensions of FinFETs are scaled further down, designers facing a tradeoff between short channel effects and source/drain resistance. Greater source/drain doping to reduce resistance increases junction depth and related short channel effects. Therefore, novel device structures are needed to provide abrupt junctions while minimizing short channel effects.

The extent of the lateral diffusion of dopants from the source/drain regions toward the channel region of the Fin-FET is also of great concern. Since precise control of dopant profile is hard to achieve when a diffusion process is used, the channel region of the FinFET may also be doped. The channel doping in FinFETs results in carrier mobility decrease and therefore performance penalty. The channel doping also leads to random dopant fluctuation (RDF) which is one of major contributors effecting chip variability. It is thus desirable to fabricate FinFETs with little or no channel doping to avoid the penalties caused by the channel doping.

SUMMARY

The present application provides FinFETs having abrupt junctions self-aligned to a gate electrode. Formation of such abrupt junctions includes diffusing dopants from an epitaxial semiconductor layer that is formed on portions of a semiconductor fin located on opposite sides of a sacrificial gate structure into the semiconductor fin to form a dopant-containing semiconductor fin by an anneal. The anneal conditions are set to ensure that highly doped regions in the dopant-containing semiconductor fin extend underneath a sacrificial gate stack in the sacrificial gate structure. The sacrificial gate stack is subsequently removed to provide a gate cavity that exposes a portion of the dopant-containing semiconductor fin. The exposed portion of the dopant-containing semiconductor fin is removed to provide an opening underneath the gate cavity. A channel region is epitaxially regrown at least from the sidewalls of the remaining portions of the dopant-containing semiconductor fin. Abrupt junctions are thus formed between the channel region and the remaining portions of the dopant-containing semiconductor fin. The abrupt junctions are self-aligned to a functional gate stack subsequently formed.

In one aspect of the present application, a semiconductor structure is provided. The semiconductor structure includes a source region and a drain region spaced apart from each other and located on a substrate, a channel region present between the source region and the drain region and on the substrate, and a gate stack present over the channel region. Sidewalls of the gate stack are vertically coincident with sidewalls of the channel region. A first abrupt junction is present at an interface between the channel region and the source region, and a second abrupt junction is present at an interface between the channel region and the drain region.

In another aspect of the present application, a method of forming a semiconductor structure is provided. The method includes forming a sacrificial gate structure over a portion of a semiconductor fin. The sacrificial gate structure includes a sacrificial gate stack and a gate spacer present on sidewalls of the sacrificial gate stack. An epitaxial semiconductor layer including dopants of a first conductivity type is then formed over portions of the semiconductor fin that is not covered by the sacrificial gate structure. Next, a dopant-containing semiconductor fin is formed by diffusing the dopants from the epitaxial semiconductor layer into the semiconductor fin. A dopant concentration profile across the dopant-containing semiconductor fin is graded such that a portion of the dopant-containing semiconductor fin underneath the sacrificial gate stack has a lower dopant concentration than another portion of the dopant-containing semiconductor fin. After removing the sacrificial gate stack to form a gate cavity that exposes a portion of the dopant-containing semiconductor fin, the exposed portion of the dopant-containing semiconductor fin is removed to provide an opening underneath the gate cavity. A channel region is then formed in the opening. Next, a functional gate stack is formed in the gate cavity over the channel region.

DETAILED DESCRIPTION

Figure 1A:
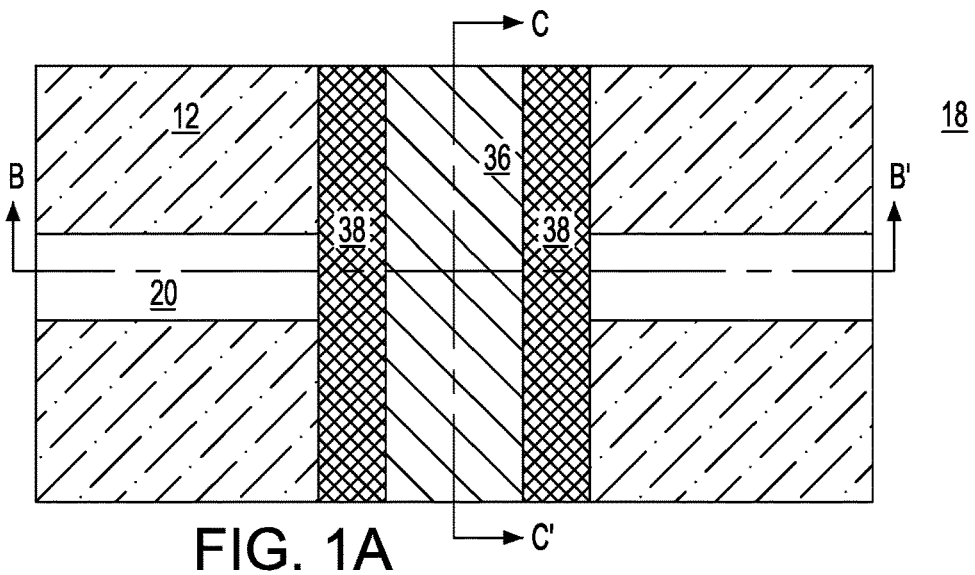
FIG. 1A is a top-down view of a first exemplary semiconductor structure including a sacrificial gate structure formed over a semiconductor fin located on a semiconductor substrate according to a first embodiment of present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1B:
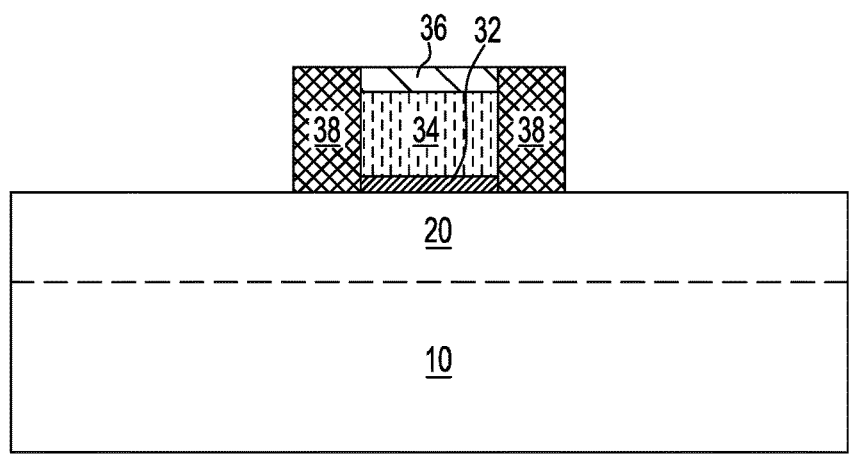
FIG. 1B is a cross-sectional view of the first exemplary semiconductor structure of FIG. 1A along line B-B'.
Figure 1C:
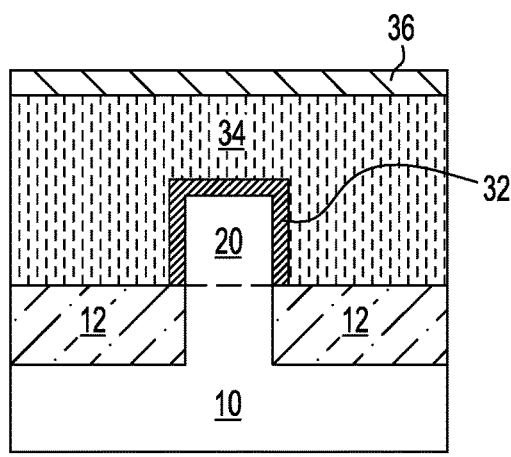
FIG. 1C is a cross-sectional view of the first exemplary semiconductor structure of FIG. 1A along line C-C'.

Referring to FIGS. 1A-1C, a first exemplary semiconductor structure according to a first embodiment of the present application includes a sacrificial gate structure formed over a semiconductor fin 20 located on a semiconductor substrate 10.

In one embodiment and as shown in FIG. 1A, the semiconductor fin 20 can be formed from a bulk semiconductor substrate including a semiconductor material throughout. The thickness of the bulk semiconductor substrate can be from 30 μm to about 2 mm, although less and greater thicknesses can also be employed.

The bulk semiconductor substrate may include a semiconductor material such as, for example, Si, Ge, SiGe, SiC, SiGeC or an III-V compound semiconductor. In one embodiment, the bulk semiconductor substrate includes a single crystalline semiconductor material, such as, for example, single crystalline silicon.

The bulk semiconductor substrate may be doped with dopants of p-type or n-type. In one embodiment, the dopants may be a p-type dopant including, but not limited to, boron (B), aluminum (Al), gallium (Ga), and indium (In). In another embodiment, the dopants may be an n-type dopant including, but not limited to, antimony (Sb), arsenic (As), and phosphorous (P). The dopant concentration in the bulk semiconductor substrate can range from $1\times10^{14}$ atoms/cm$^3$ to $3\times10^{17}$ atoms/cm$^3$, although lesser and greater dopant concentrations can also be employed.

An upper portion of the bulk semiconductor substrate is patterned using lithography and etching to form a semiconductor portion. The lithographic step includes applying a photoresist layer (not shown) atop the bulk semiconductor substrate, exposing the photoresist layer to a desired pattern of radiation, and developing the exposed photoresist layer utilizing a conventional resist developer. The etching process can be dry etching such as, for example, reactive ion etch (RIE) and/or wet chemical etching. The etching process transfers the pattern from the patterned photoresist layer into the bulk semiconductor substrate. After transferring the pattern into the bulk semiconductor substrate, the patterned photoresist layer can be removed utilizing a conventional resist stripping process such as, for example, ashing. Alternatively, the semiconductor portion can also be formed utilizing a sidewall image transfer (SIT) process. In a typical SIT process, spacers are formed on a sacrificial mandrel. The sacrificial mandrel is removed and the remaining spacers are used as a hard mask to etch the bulk semiconductor substrate. The spacers are then removed after the semiconductor portions have been formed.

After forming the semiconductor portion, an insulator layer 12 is formed laterally surrounding a lower portion of the semiconductor portion. The insulator layer 12 can be formed by first depositing a dielectric material in the trenches (not shown) etched on opposite sides of the semiconductor portion. The insulator layer 12 may include a dielectric oxide such as, for example, silicon dioxide and may be formed by a deposition process, such as chemical vapor deposition (CVD) or physically vapor deposition (PVD). The insulator layer 12 may then be etched back to expose an upper portion of the semiconductor portion. An anisotropic etch such as, for example, RIE can be employed to remove the dielectric material of the insulator layer 12 selective to the semiconductor material of the semiconductor portion. The upper portion of the semiconductor portion that protrudes above the insulator layer 12 constitutes the semiconductor fin 20. The lower portion of the semiconductor portion that is laterally surrounded by the insulator layer 12 and the unpatterned portion of the bulk semiconductor substrate together constitute the semiconductor substrate 10.

The semiconductor fin 20 that is formed can have a rectangular horizontal cross-sectional area. The width of the semiconductor fin 20 can be from 5 nm to 100 nm, although lesser and greater widths can also be employed. The height of the semiconductor fin 20 can be from 10 nm to 200 nm, although lesser and greater heights can also be employed.

After forming the semiconductor fin 20, the sacrificial gate structure is formed over the semiconductor fin 20. The sacrificial gate structure is separated from the semiconductor substrate 10 by the insulator layer 12. The sacrificial gate structure includes a sacrificial gate stack of, from bottom to top, a sacrificial gate dielectric 32, a sacrificial gate conductor 34 and a sacrificial gate cap 36, and a gate spacer 38 present on sidewalls of the sacrificial gate stacks (32, 34, 36). In some embodiments of the present application, the sacrificial gate dielectric 32 and/or the sacrificial gate cap 36 can be omitted.

The sacrificial gate stack (32, 34, 36) can be formed by first providing a material stack (not shown) that includes, from bottom to top, a sacrificial gate dielectric layer, a sacrificial gate conductor layer and a sacrificial gate cap layer over the semiconductor fin 20 and the insulator layer 12. In some embodiments of the present application and as mentioned above, the sacrificial gate dielectric layer can be omitted. When present, the sacrificial gate dielectric layer includes a dielectric material such as an oxide or a nitride. In one embodiment, the sacrificial gate dielectric layer is composed of silicon oxide, silicon nitride or silicon oxynitride. The sacrificial gate dielectric layer can be formed by a conventional deposition process, including but not limited to, CVD or PVD. The sacrificial gate dielectric layer can also be formed by conversion of a surface portion of the semiconductor fin 20. The sacrificial gate dielectric layer that is formed may have a thickness from 1 nm to 10 nm, although lesser and greater thicknesses can also be employed.

The sacrificial gate conductor layer can include a semiconductor material such as polysilicon or a silicon-containing semiconductor alloy such as a silicon-germanium alloy. The sacrificial gate conductor layer can be formed using CVD or PECVD. The sacrificial gate conductor layer that is formed may have a thickness from 20 nm to 300 nm, although lesser and greater thicknesses can also be employed.

The sacrificial gate cap layer may include a dielectric material such as an oxide, a nitride or an oxynitride. In one embodiment, the sacrificial gate cap layer is composed of silicon nitride. The sacrificial gate cap layer can be formed utilizing a conventional deposition process including, for example, CVD and PECVD. The sacrificial gate cap layer that is formed may have a thickness from 10 nm to 200 nm, although lesser and greater thicknesses can also be employed.

The material stack can then be patterned by lithography and etching to form the sacrificial gate stacks (32, 34, 36). Specifically, a photoresist layer (not shown) is applied over the topmost surface of the material stack and is lithographically patterned by lithographic exposure and development. The pattern in the photoresist layer is transferred into the material stack by an etch, which can be an anisotropic etch such as RIE. The remaining portion of the material stack after the pattern transfer constitutes the sacrificial gate stack (32, 34, 36). The remaining portion of the photoresist layer may be subsequently removed.

The gate spacer 38 may include a dielectric material such as, for example, an oxide, a nitride, an oxynitride, or any combination thereof. For example, the gate spacer 38 may be composed of silicon nitride, silicon boron carbon nitride (SiBCN), or silicon carbon oxynitride (SiOCN). The gate spacer 38 can be formed by first conformally depositing a gate spacer material layer (not shown) on exposed surfaces of the sacrificial gate stack (32, 34, 36), the semiconductor fin 20 and the insulator layer 12 and then etching the gate spacer material layer to remove horizontal portions of the gate spacer material layer. The gate spacer material layer can be provided by a conformal deposition process including, for example, CVD, PECVD or PVD. The etching of the conformal gate spacer material layer may be performed by a dry etch process such as, for example, RIE. The remaining portion of the gate spacer material layer constitutes the gate spacer 38. The width of the gate spacer 38, as measured at the base of the gate spacer 38 can be from 5 nm to 100 nm, although lesser and greater widths can also be employed.

Figure 2A:
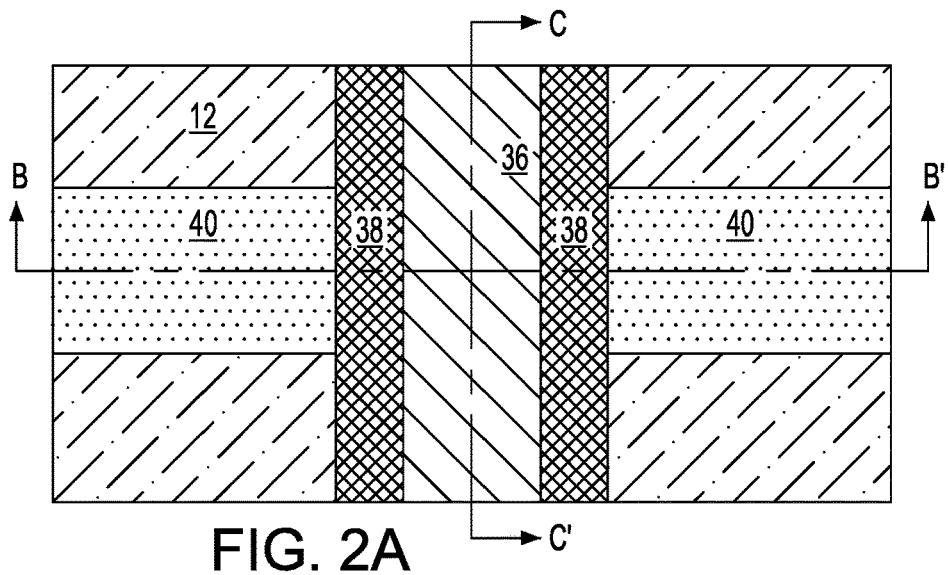
FIG. 2A is a top-down view of the first exemplary semiconductor structure of FIGS. 1A-1C after forming an epitaxial semiconductor layer on exposed surfaces of the semiconductor fin.
Figure 2B:
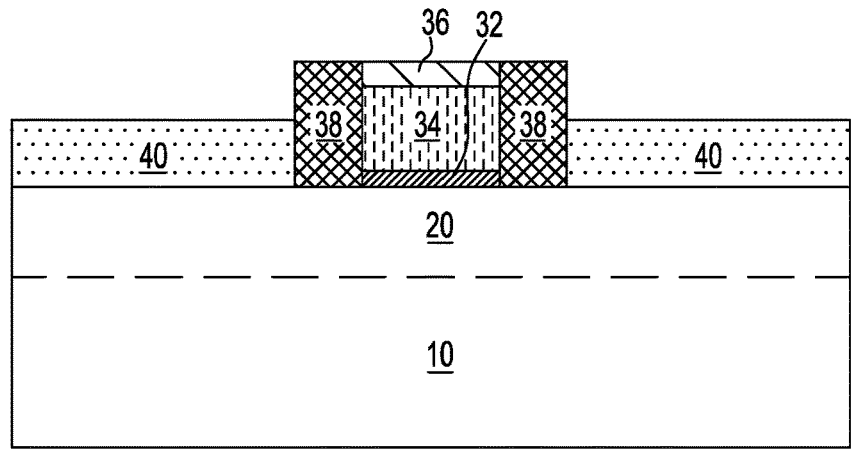
FIG. 2B is a cross-sectional view of the first exemplary semiconductor structure of FIG. 2A along line B-B'.
Figure 2C:
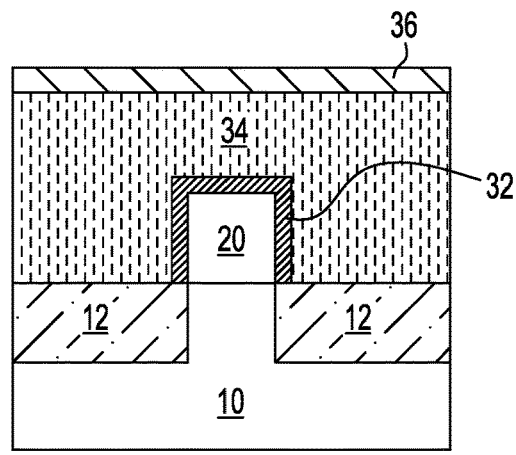
FIG. 2C is a cross-sectional view of the first exemplary semiconductor structure of FIG. 2A along line C-C'.

Referring to FIGS. 2A-2C, an epitaxial semiconductor layer 40 is formed on exposed surfaces of the semiconductor fin 20 utilizing a selective epitaxial growth process. The term "epitaxial growth and/or deposition" means the growth of a semiconductor material on a deposition surface of a semiconductor material, in which the semiconductor material being grown has the same (or nearly the same) crystalline characteristics as the semiconductor material of the deposition surface. During the selective epitaxial growth process, the deposited semiconductor material grows only on exposed semiconductor surfaces, i.e., portions of the semiconductor fin 20 located on opposite sides of the sacrificial gate structures (32, 34, 36, 38) and does not grow on dielectric surfaces, such as surfaces of the insulator layer 12, the sacrificial gate cap 36 and the gate spacer 28. The epitaxial semiconductor layer 40 provides a raised source region and a raised drain region (collectively referred to as raised source/drain regions) of a semiconductor device.

The epitaxial semiconductor layer 40 is doped in-situ with dopants of p-type or n-type during the selective epitaxial growth process. Alternatively, an ion implantation can be performed to introduce dopants into the epitaxial semiconductor layer 40 before or after the selective epitaxial growth process. The implant can also be done without growing the epitaxial layer 40. The conductivity type of the epitaxial semiconductor layer 40 and of the implant is opposite of the conductivity type of the bulk semiconductor substrate if the bulk semiconductor substrate is doped. For example, if the bulk semiconductor substrate is doped with a p-type dopant, the epitaxial semiconductor layer 40 can be doped with an n-type dopant, and vice versa. In one embodiment, the epitaxial semiconductor layer 40 has a dopant concentration of $1\times10^{21}$ atoms/cm$^3$ or higher.

Figure 3A:
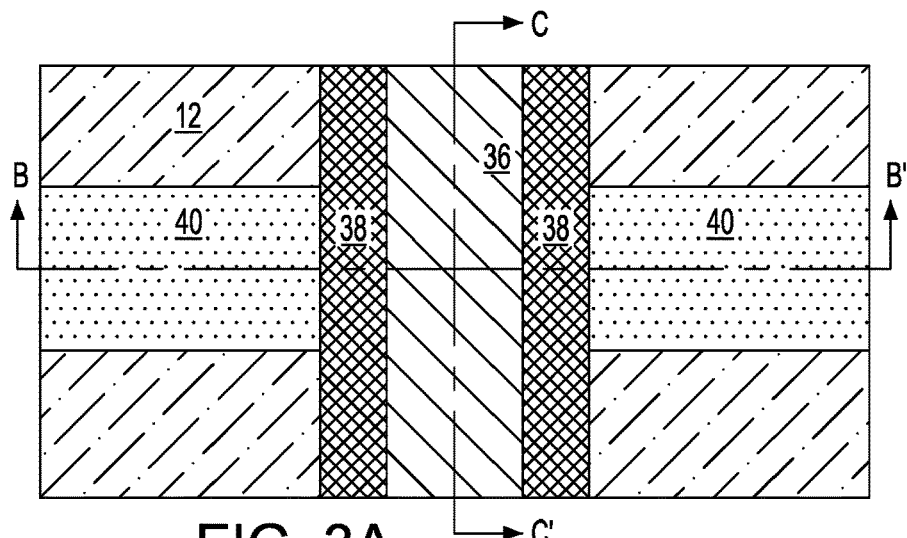
FIG. 3A is a top-down view of the first exemplary semiconductor structure of FIGS. 2A-2C after forming a dopant-containing semiconductor fin.

The epitaxial semiconductor layer 40 may be composed of Si, SiGe, Ge, a compound semiconductor or a combination thereof. In one embodiment, the epitaxial semiconductor layer 40 is composed of boron doped SiGe suitable for p-type FinFETs. Other p-type dopants may also be used depending on the design requirements of the p-type FinFETs. In another embodiment, the epitaxial semiconductor layer 40 is composed of phosphorus (other n-type dopants may be used as well) doped silicon or silicon-carbon (Si:C) suitable for n-type FinFETs. Other n-type dopants may also be used depending on the design requirements of the n-type FinFETs Referring to FIGS. 3A-3C, the dopants from the epitaxial semiconductor layer 40 are diffused into the semiconductor fin 20 to form a dopant-containing semiconductor fin 22. Due to the lateral diffusion of the dopants, the dopant-containing semiconductor fin 22 has a non-uniform dopant concentration profile such that the dopant concentration in the dopant-containing semiconductor fin 22 decreases as the distance from the interface between the semiconductor fin 20 and the epitaxial semiconductor layer 40 increases. That is, the dopant concentration of the dopant-containing semiconductor fin 22 decreases gradually towards the center of the dopant-containing semiconductor fin 22 underneath the gate stack (32, 34, 36). In one embodiment, the dopant concentration of the dopant-containing semiconductor fin 22 may decrease to zero in the vicinity of the center of the dopant-containing semiconductor fin 22 underneath the gate stack (32, 34, 36).

In one embodiment, the dopants from the epitaxial semiconductor layer 40 can be diffused into the semiconductor fin 20 by an annealing processes including, but not limited to, rapid thermal annealing, furnace annealing, flash lamp annealing, laser annealing, or a combination thereof. The specific annealing conductions are selected such that portions of the dopant-containing semiconductor fin 22 located beneath the gate spacer 38 are highly doped to ensure a low resistivity under the gate spacer 38. In one embodiment, a rapid thermal annealing can be employed to form the dopant-containing semiconductor fin 22. The annealing process can be conducted at a temperature ranging from 800° C. to 1400° C.

Figure 3B:
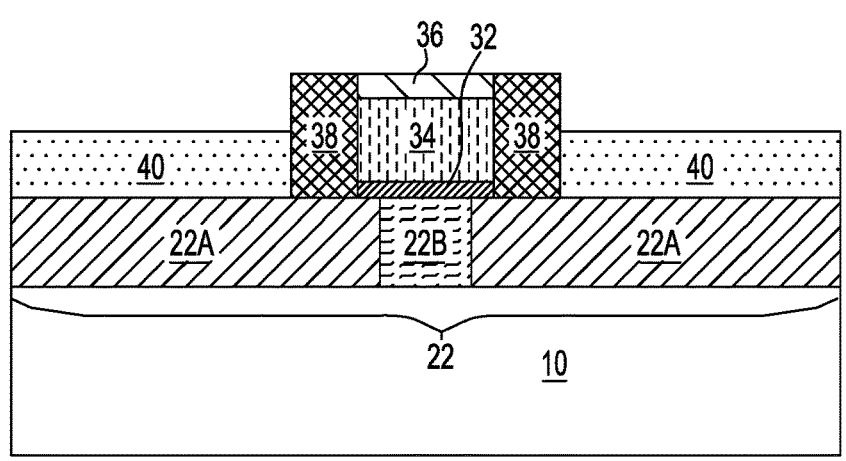
FIG. 3B is a cross-sectional view of the first exemplary semiconductor structure of FIG. 3A along line B-B'.
Figure 3C:
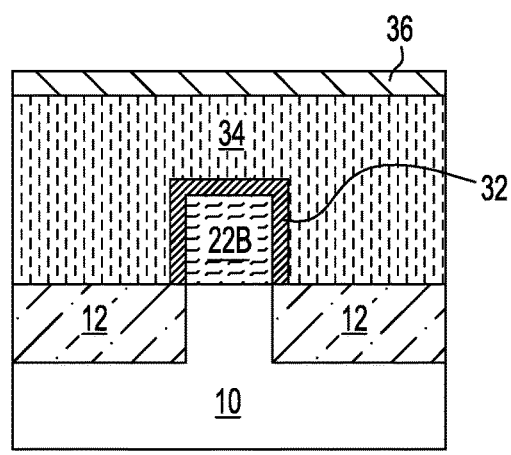
FIG. 3C is a cross-sectional view of the first exemplary semiconductor structure of FIG. 3A along line C-C'.

In one embodiment and as shown in FIG. 3B, after annealing, the dopant-containing semiconductor fin 20 can consist of a first region 22A which is a highly doped region and a second region 22B which is a lightly doped region. As used herein, a highly doped region is a region having a dopant concentration in excess of $1\times10^{19}$ atoms/cm$^3$. As used herein, a lightly doped region is a region having a dopant concentration below $1\times10^{19}$ atoms/cm$^3$. In one embodiment, sidewalls of the first region 22A that are proximal to the gate spacer 38 are aligned with the inner sidewalls of the gate spacer 38 (not shown). In another embodiment and as shown in FIG. 3B, the first region 22A may extend beyond the inner sidewalls of the gate spacer 38 and into the region directly below the sacrificial gate dielectric 32. The overlapping of the first region 22A with the sacrificial gate stack (32, 34, 36) ensures that an entirety of the bottom surface of the gate spacer 38 is in contact with the highly doped region (i.e., the first region 22A) of the dopant-containing semiconductor fin 22. As a result, the fin resistance under the gate spacer 38 is reduced.

Figure 4A:
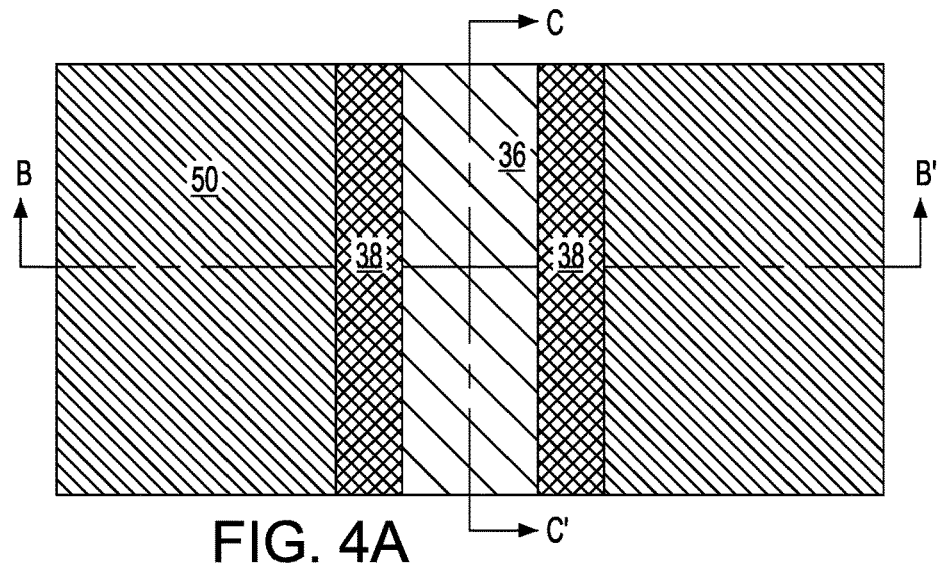
FIG. 4A is a top-down view of the first exemplary semiconductor structure of FIGS. 3A-3C after forming an interlevel dielectric (ILD) layer over the epitaxial semiconductor layer and the semiconductor substrate.
Figure 4B:
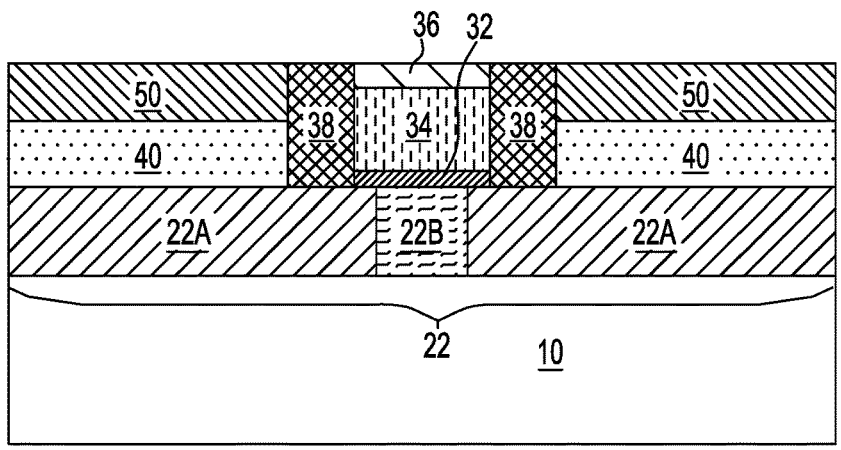
FIG. 4B is a cross-sectional view of the first exemplary semiconductor structure of FIG. 4A along line B-B'.
Figure 4C:
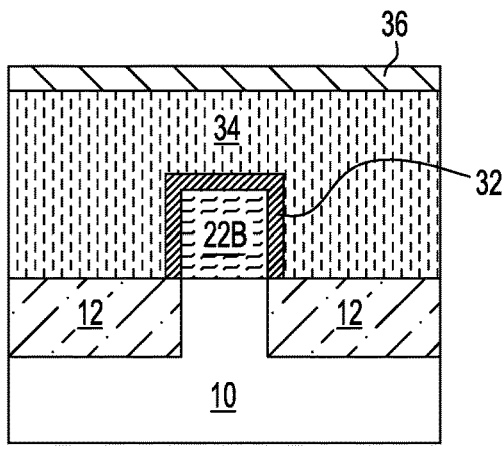
FIG. 4C is a cross-sectional view of the first exemplary semiconductor structure of FIG. 4A along line C-C'.

Referring to FIGS. 4A-4C, an interlevel dielectric (ILD) layer 50 is formed over the epitaxial semiconductor layer 40 and the insulator layer 12. The ILD layer 50 laterally surrounds the sacrificial gate structure (32, 34, 36, 38). In some embodiments of the present application, the ILD layer 50 is composed of a dielectric material that can be easily planarized. For example, the ILD layer 50 can include a doped silicate glass, an undoped silicate glass (silicon oxide), an organosilicate glass (OSG), a porous dielectric material or amorphous carbon. The ILD layer 50 can be deposited using a conventional deposition process, such as, for example, CVD, PECVD or spin coating and subsequently planarized, for example, by CMP using the top surface of the sacrificial gate cap 36 as an etch stop. The top surface of the ILD layer 50 thus is coplanar with the top surface of the sacrificial gate cap 36.

Figure 5A:
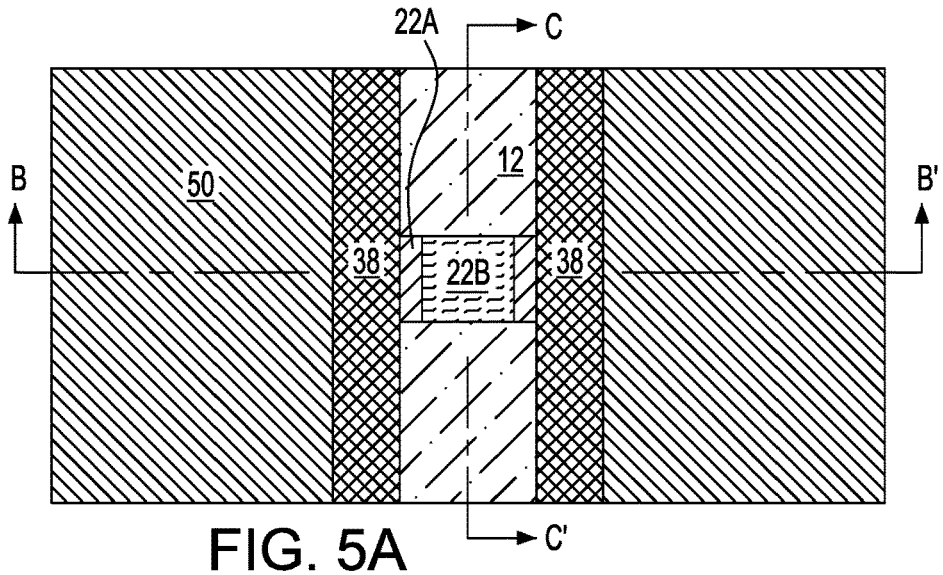
FIG. 5A is a top-down view of the first exemplary semiconductor structure of FIGS. 4A-4C after forming a gate cavity.
Figure 5B:
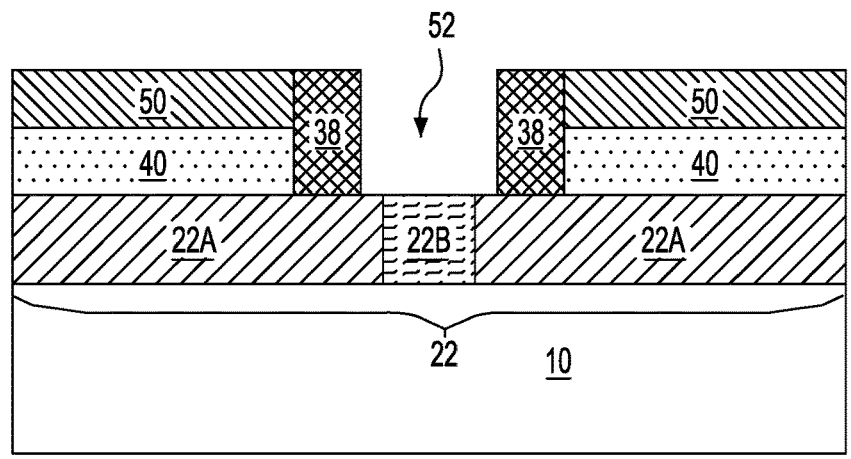
FIG. 5B is a cross-sectional view of the first exemplary semiconductor structure of FIG. 5A along line B-B'.
Figure 5C:
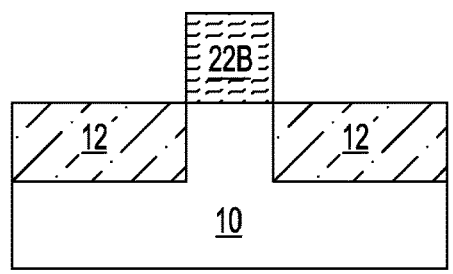
FIG. 5C is a cross-sectional view of the first exemplary semiconductor structure of FIG. 5A along line C-C'.

Referring to FIGS. 5A-5C, the sacrificial gate stack (32, 34, 36) is removed to provide a gate cavity 52. Various components of the sacrificial gate stack (32, 34, 36) can be removed selectively to the semiconductor material of the semiconductor fin 20 and the dielectric materials of the gate spacer 38, the ILD layer 50 and the insulator layer 12 utilizing at least one etch. The etch can be a wet etch such as an ammonia etch or a dry etch such as RIE. The gate cavity 52 is thus formed within a volume from which the sacrificial gate stack (32, 34, 36) is removed and is laterally confined by the inner sidewalls of the gate spacer 38. The gate cavity 52 exposes a portion (i.e. the entire second region 22B and portions of the first region 22A adjoined to the second region 22B) of the dopant-containing semiconductor fin 22.

Figure 6A:
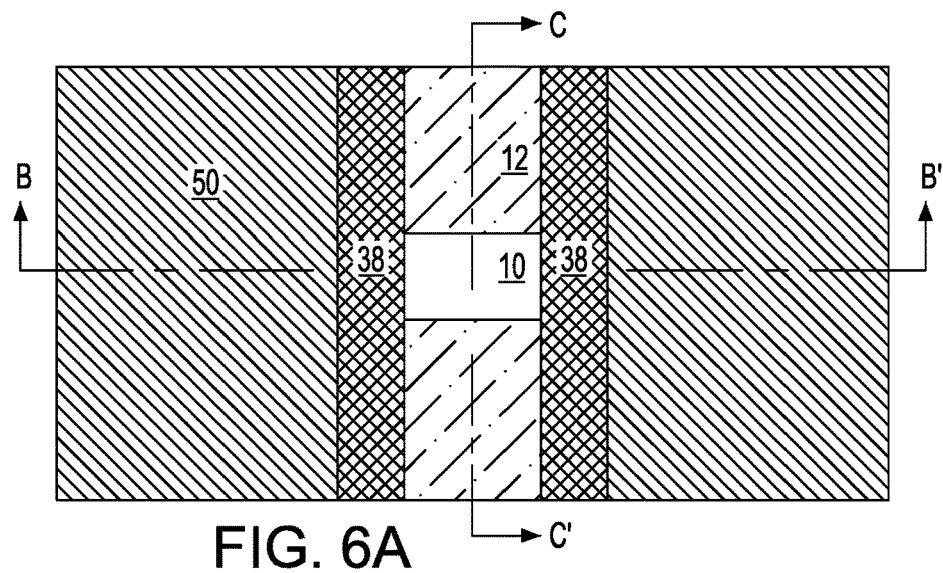
FIG. 6A is a top-down view of the first exemplary semiconductor structure of FIGS. 5A-5C after removing a portion of the dopant-containing semiconductor fin exposed by the gate cavity to provide an opening underneath the gate cavity.
Figure 6B:
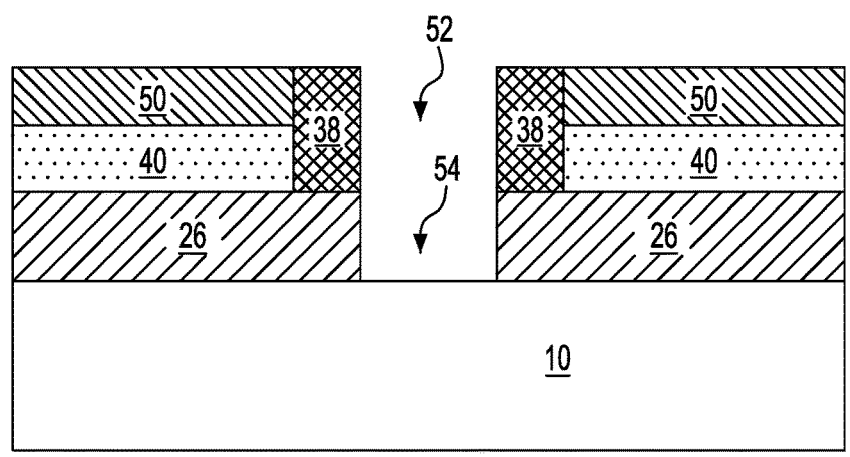
FIG. 6B is a cross-sectional view of the first exemplary semiconductor structure of FIG. 6A along line B-B'.
Figure 6C:
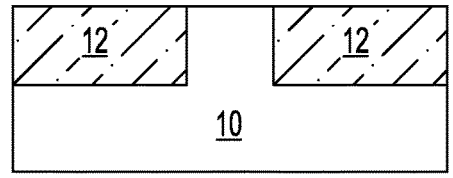
FIG. 6C is a cross-sectional view of the first exemplary semiconductor structure of FIG. 6A along line C-C'.

Referring to FIGS. 6A-6C, the portion of the dopant-containing semiconductor fin 22 exposed by the gate cavity 52 is completely removed. An anisotropic etch can be employed to remove the semiconductor material of the dopant-containing semiconductor fin 22 selective to the dielectric materials of the gate spacer 38, the ILD layer 50 and the insulator layer 12. The anisotropic etch can be a dry etch such as, for example, RIE or a wet etch. An opening 54 thus is formed under the gate cavity 52 after the exposed portion of the dopant-containing semiconductor fin 22 is removed. The opening 54 exposes a top surface of the semiconductor substrate 10. The remaining portions of the dopant-containing semiconductor 22 (i.e., remaining portions of the first region 22A) are herein referred to as extension regions 26. The extension regions 26 are a component of the source/drain regions of a semiconductor device. The sidewalls of the extension regions 26 are vertically coincident with the inner sidewalls of the gate spacer 38.

Figure 7A:
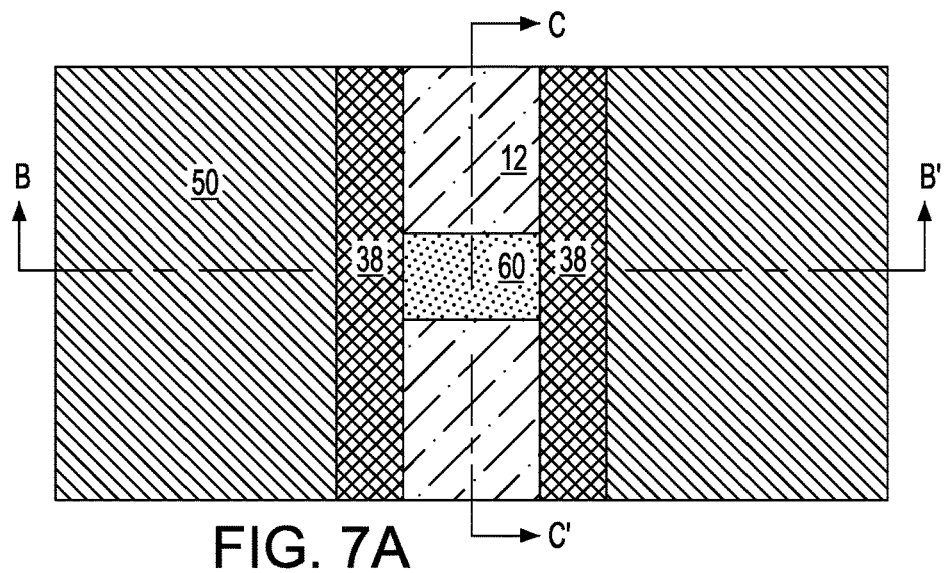
FIG. 7A is a top-down view of the first exemplary semiconductor structure of FIGS. 6A-6C after forming a channel region in the opening.
Figure 7B:
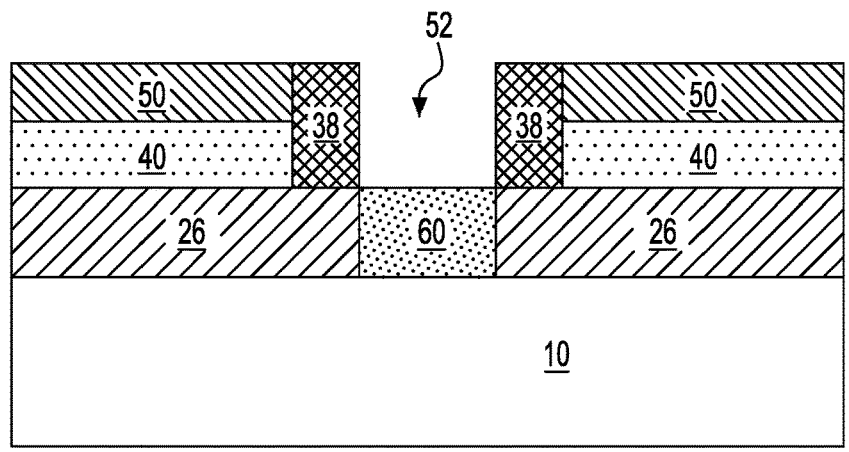
FIG. 7B is a cross-sectional view of the first exemplary semiconductor structure of FIG. 7A along line B-B'.
Figure 7C:
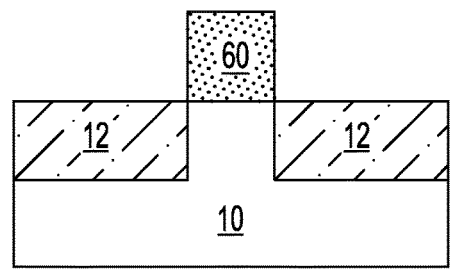
FIG. 7C is a cross-sectional view of the first exemplary semiconductor structure of FIG. 7A along line C-C'.

Referring to FIGS. 7A-7C, a channel region 60 is formed in the opening 54 by a selective epitaxial growth process. During the selective epitaxial growth process, the semiconductor material grows only from exposed semiconductor surfaces, i.e., the physically exposed sidewalls of the extension regions 26 and the top surface of the semiconductor substrate 10, but not on dielectric surfaces such as surfaces of the insulator layer 12, the gate spacer 38 and the ILD layer 50. The selective epitaxial growth process is continued until the top surface of the channel region 60 is coplanar with the top surfaces of the extension regions 26.

The channel region 60 may include a semiconductor material the same as, or different from, the semiconductor material of the semiconductor fin 20. In one embodiment and when semiconductor fin 20 is composed of silicon, the channel region 60 can include germanium.

In one embodiment, the channel region 60 is provided as an intrinsic semiconductor region and is epitaxially aligned with the semiconductor substrate 10 and the extension regions 26. In another embodiment, the channel region 60 is provided as a doped semiconductor region containing dopants having a conductivity type opposite to the dopants in the epitaxial semiconductor layer 40 and the extension regions 26. Thus when the extension regions 26 contain an n-type dopant, and the channel region 60 can include a p-type dopant, and vice versa. The channel region 60 is lightly doped and has a dopant concentration at least 10 times smaller than that of the extension regions 26. For example, the dopant concentration of the channel region 60 can be from $1 \times 10^{17}$ atoms/cm$^3$ to $1 \times 10^{19}$ atoms/cm$^3$. The channel region 60 may be doped in-situ during the epitaxial growth process or, alternatively, by a subsequent ion implantation process after growth of an intrinsic semiconductor material. In some embodiments of the present application, after formation of the channel region 60, an anneal may be performed to optimize the link-up between the channel region 60 and adjacent extension regions 26.

A pair of abrupt junctions is formed at the interfaces between the channel region 60 and the extension regions 26. An abrupt junction is where the change of the doping concentration is very steep. For the purpose of the present application, an abrupt junction is one that is less than 3 nm/decade, meaning that the concentration changes by a factor of 10 within 3 nm.

In the present application, by re-growing the channel region 60 from the sidewalls of the extension regions 26 and the top surface of the semiconductor substrate 10 to provide an undoped or lightly doped channel region between the highly doped extension regions 26, abrupt junctions can be obtained. In addition, since sidewalls of the extension regions 26 are vertically coincident with the inner sidewalls of the gate spacer 38, the abrupt junctions formed in the present application are self-aligned with a functional gate stack later formed in the gate cavity 52. By eliminating the overlap between the gate and the channel, short channel effect can thus be reduced. The junction formation process of the present application thus allows simultaneously reducing resistance under the gate spacer and minimizing short channel effect.

Figure 8A:
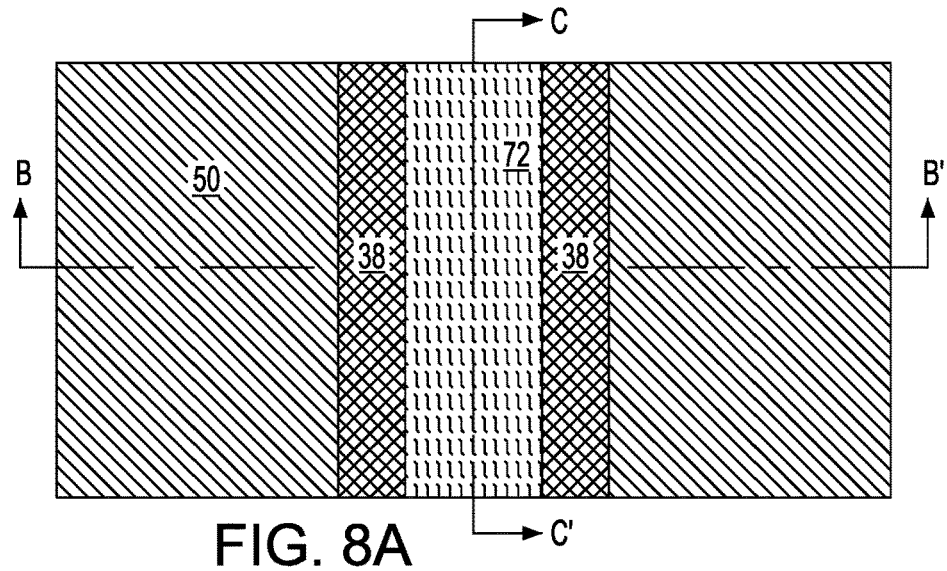
FIG. 8A is a top-down view of the first exemplary semiconductor structure of FIGS. 7A-7C after forming a functional gate stack in the gate cavity.
Figure 8B:
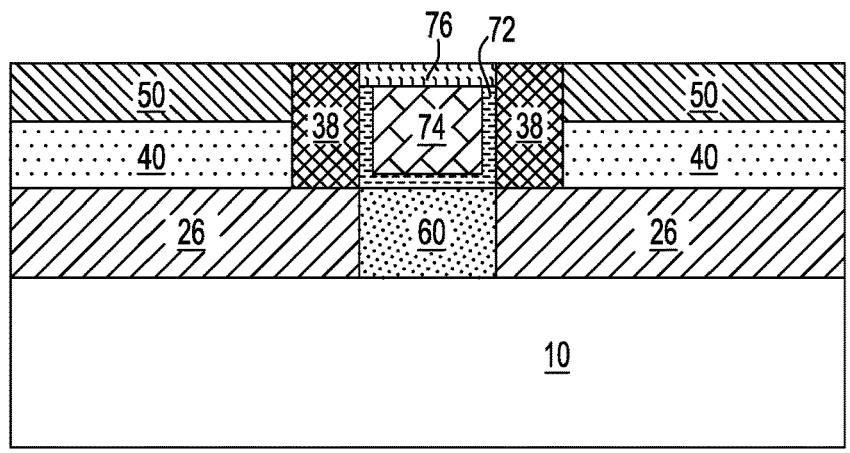
FIG. 8B is a cross-sectional view of the first exemplary semiconductor structure of FIG. 8A along line B-B'.
Figure 8C:
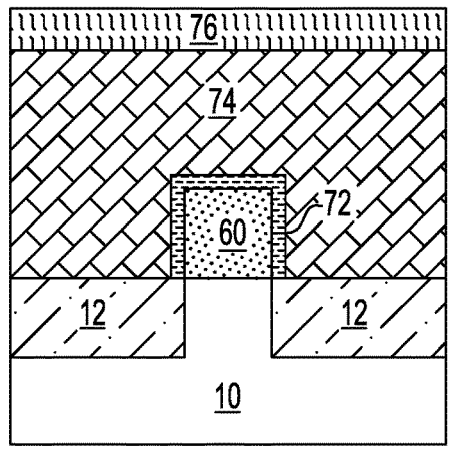
FIG. 8C is a cross-sectional view of the first exemplary semiconductor structure of FIG. 8A along line C-C'.

Referring to FIGS. 8A-8C, a functional gate stack is formed in the gate cavity 52 straddling the channel region 60. The function gate stack includes, from bottom to top, a gate dielectric 72, a gate conductor 74 and a gate cap 76. The functional gate stack (72, 74, 76) and the gate spacer 38 present on opposite sidewalls of the functional gate stack (72, 74, 76) constitute a functional gate structure.

The functional gate stack (72, 74, 76) can be formed by first depositing a conformal gate dielectric layer (not shown) on a bottom surface and sidewalls of the gate cavity 52 and the top surface of the ILD layer 50. The gate dielectric layer can be a high dielectric constant (high-k) material layer having a dielectric constant greater than 8.0. Exemplary high-k materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In one embodiment, the gate dielectric layer includes $HfO_2$. The gate dielectric layer can be formed by a conventional deposition process including, but not limited to, CVD, PVD, atomic layer deposition (ALD), molecular beam epitaxy (MBE), ion beam deposition, electron beam deposition, and laser assisted deposition. The gate dielectric layer that is formed may have a thickness ranging from 0.9 nm to 6 nm, although lesser and greater thicknesses can also be employed. The gate dielectric layer may have an effective oxide thickness on the order of or less than 1 nm.

The remaining volume of the gate cavity 52 is then filled with a gate conductor layer (not shown). The gate conductor layer can include any conductive material which may be a doped semiconductor material or a metallic material, such as, for example, tungsten, titanium, tantalum, aluminum, nickel, ruthenium, palladium and platinum. In one embodiment, the gate conductor layer is composed of tungsten.

The gate conductor layer can be formed utilizing a conventional deposition process including, for example, CVD, PECVD, PVD, sputtering, chemical solution deposition and ALD. When silicon-containing materials are used as the gate conductor layer, the silicon-containing materials can be doped with an appropriate impurity by utilizing either an in-situ doping deposition process or by utilizing deposition, followed by a step such as ion implantation or gas phase doping in which the appropriate impurity is introduced into the silicon-containing material.

In some embodiment of the present application, prior to the formation of the gate conductor layer, a work function metal layer (not shown) may be conformally deposited over the gate dielectric layer employing CVD, sputtering or plating. The work function metal layer includes a metal having a work function suitable to tune the work function of a FinFET subsequently formed. The thickness of the work function metal layer can be from 3 nm to 15 nm, although lesser and greater thicknesses can also be employed.

The portion of the gate conductor layer formed above the top surface of the ILD layer 50 can be removed, for example, by CMP. The portion of the gate dielectric layer that is formed above the top surface of the ILD layer 50 may also be subsequently removed. In some embodiments and as illustrated, the remaining portions of the gate conductor layer and the remaining portions of the gate dielectric layer may be recessed utilizing a dry etch or a wet etch to provide a void (not shown) in the gate cavity 52. The remaining portion of the gate conductor layer constitutes the gate conductor 74, and the remaining portion of the gate dielectric layer constitutes the gate dielectric 72.

A gate cap material is then deposited over the gate dielectric 72 and the gate conductor 74 in the gate cavity 52 and planarized to fill void that is formed after recessing the gate conductor layer and the gate dielectric layer. Exemplary gate cap materials include, but are not limited to, silicon nitride, silicon carbide nitride, or silicon boron carbonitride. The deposition of the gate cap material can be performed utilizing a conventional deposition process such as, for example, CVD or PECVD. Following the deposition of the gate cap material, the deposited gate cap material can be subsequently planarized, for example, by CMP using the top surface of the ILD layer 50 as an etch stop to provide the gate cap 76. The top surface of the gate cap 76 can be coplanar with the top surface of the ILD layer 50.

In the present application, a major portion of the channel region underneath the functional gate stack (72, 74, 76) remains intrinsic or lightly doped, the short channel effects can thus be minimized.

Figure 9A:
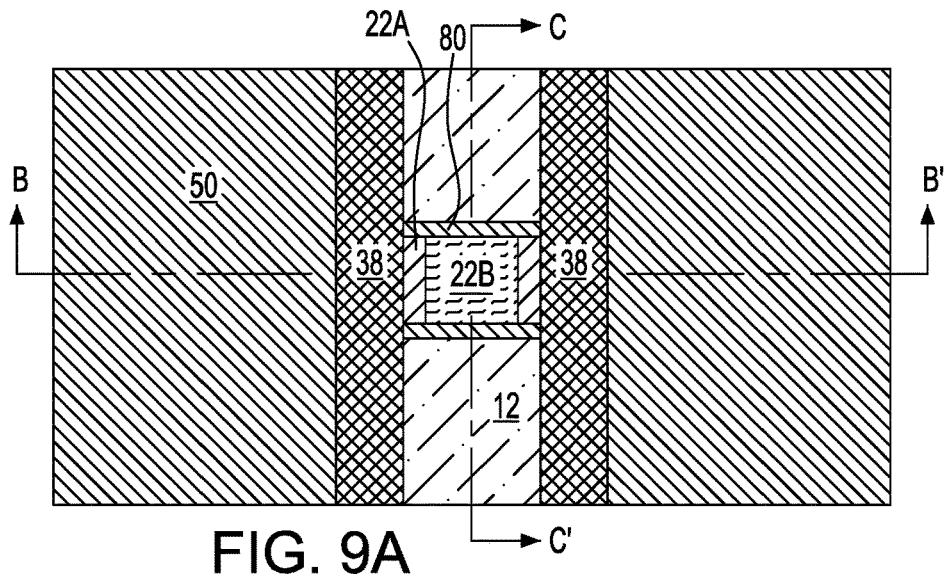
FIG. 9A is a top-down view of a first variation of the first exemplary semiconductor structure of FIGS. 5A-5C after forming a sacrificial spacer on sidewalls of a portion of the dopant-containing semiconductor fin that is exposed by the gate cavity.
Figure 9B:
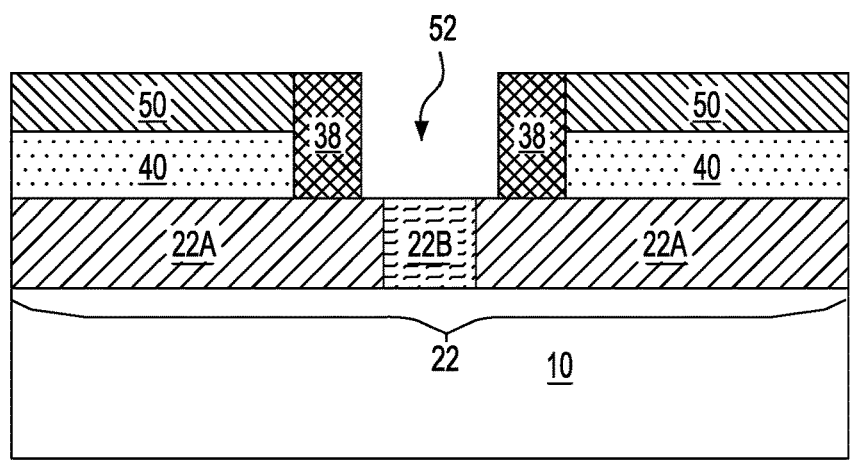
FIG. 9B is a cross-sectional view of the first variation of the first exemplary semiconductor structure of FIG. 9A along line B-B'.
Figure 9C:
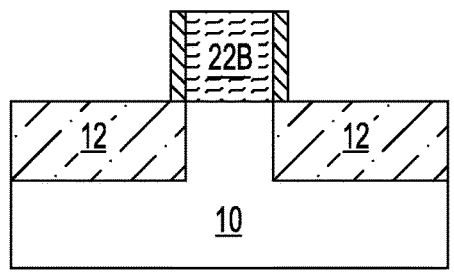
FIG. 9C is a cross-sectional view of the first variation of the first exemplary semiconductor structure of FIG. 9A along line C-C'.

Referring to FIGS. 9A-9C, a first variation of the first exemplary semiconductor structure of the present application can be derived from the first exemplary semiconductor structure of FIGS. 5A-5C by forming a sacrificial spacer 80 on sidewalls of the exposed portion of the dopant-containing semiconductor fin 22 in the gate cavity 52. The sacrificial spacer 80 can include a material different from the semiconductor material of the dopant-containing semiconductor fin 22. For example, the sacrificial spacer 80 can include a dielectric material such as silicon nitride or silicon oxynitride, a dielectric meal oxide, a dielectric metal nitride, or amorphous carbon. The sacrificial spacer 80 can be formed, for example, by depositing a conformal sacrificial spacer material layer (not shown) on the physically exposed surfaces of the dopant-containing semiconductor fin 22, the insulator layer 12, the gate spacer 38 and the ILD layer 50, and anisotropically etching the conformal sacrificial spacer material layer. Horizontal portions of the conformal sacrificial spacer material layer are removed by the anisotropic etch, and the remaining vertical portions of the conformal sacrificial spacer material layer present on the sidewalls of the exposed portion of the dopant-containing semiconductor fin 22 constitute the sacrificial gate spacer 80. The sacrificial spacer 80 laterally surrounds the exposed portion of the dopant-containing semiconductor fin 22.

Figure 10A:
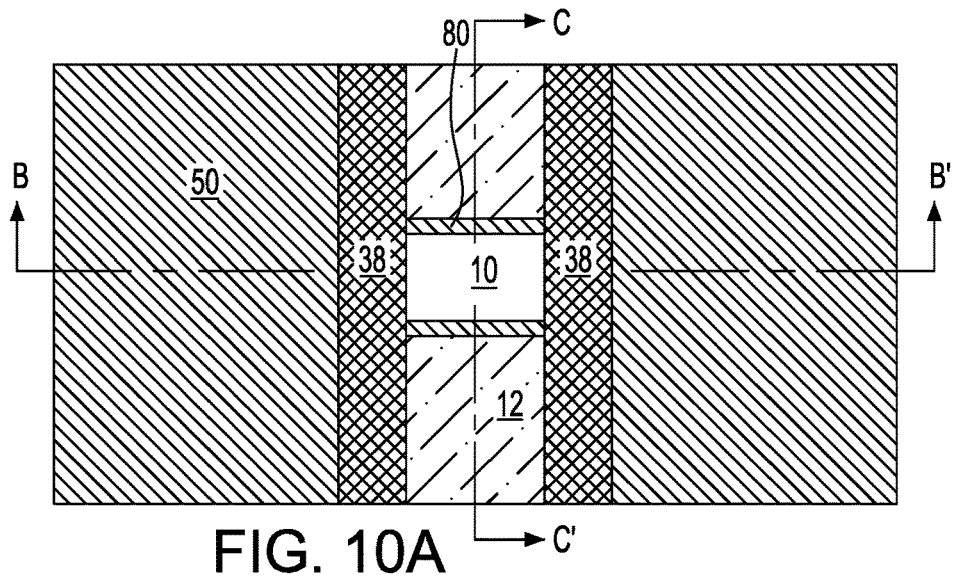
FIG. 10A is a top-down view of the first variation of the first exemplary semiconductor structure of FIGS. 9A-9C after removing the portion of the dopant-containing semiconductor fin exposed by the gate cavity to provide the opening.
Figure 10B:
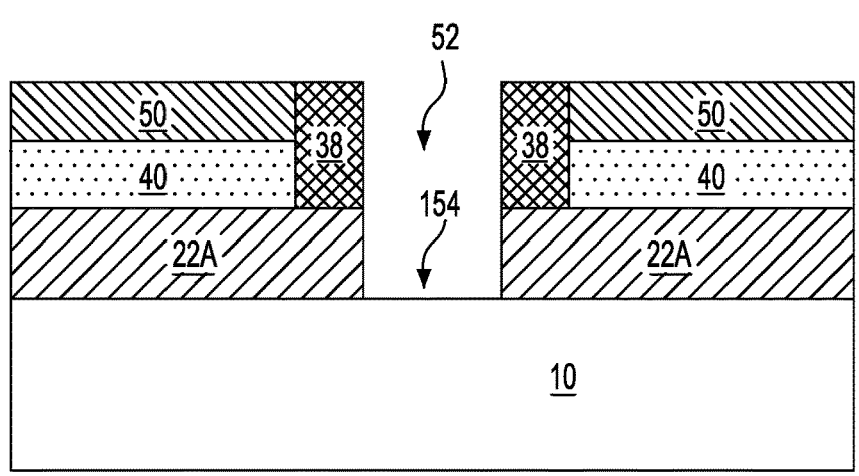
FIG. 10B is a cross-sectional view of the first variation of the first exemplary semiconductor structure of FIG. 10A along line B-B'.
Figure 10C:
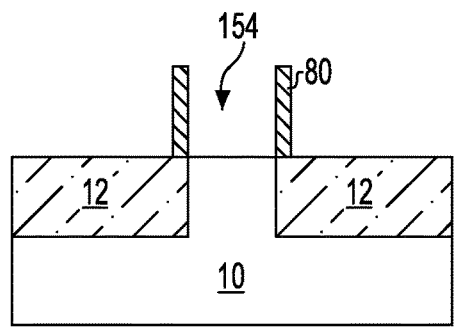
FIG. 10C is a cross-sectional view of the first variation of the first exemplary semiconductor structure of FIG. 10A along line C-C'.

Referring to FIGS. 10A-10C, the portion of the dopant-containing semiconductor fin 22 exposed in the gate cavity 52 is completely removed by performing processing steps of FIGS. 6A-6C. The removal of the exposed portion of the dopant-containing semiconductor fin 22 provides an opening 154 laterally surrounded by the sacrificial spacer 80. The lateral dimension of the opening 154 is thus defined by the sacrificial spacer 80.

Figure 11A:
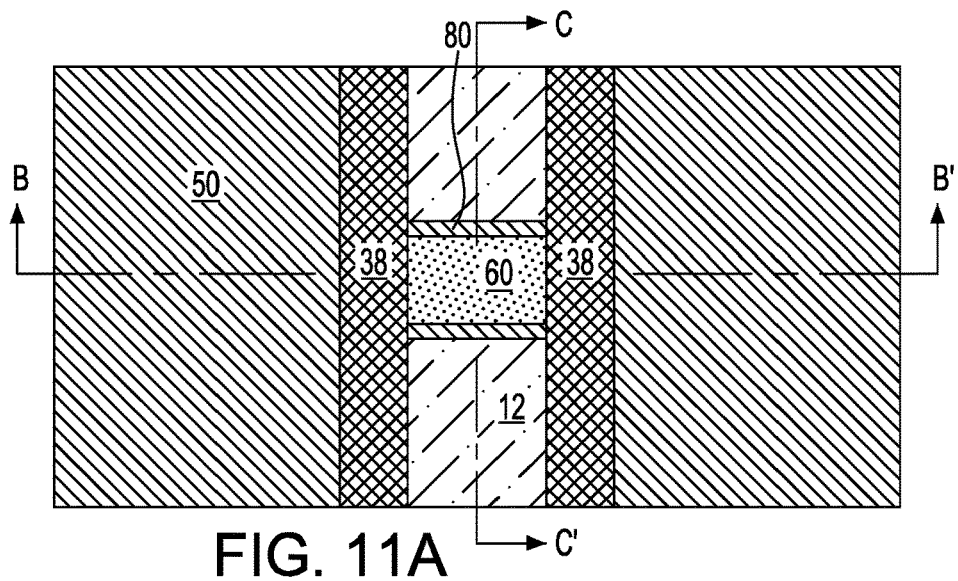
FIG. 11A is a top-down view of the first variation of the first exemplary semiconductor structure of FIGS. 10A-10C after forming the channel region in the opening.
Figure 11B:
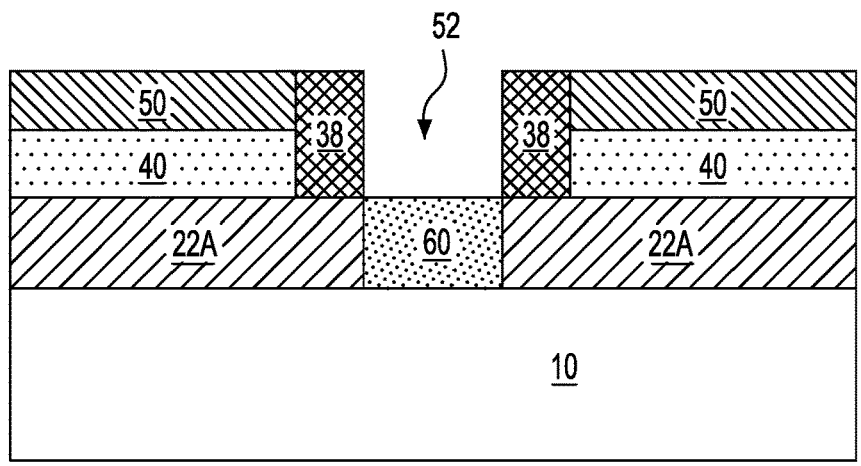
FIG. 11B is a cross-sectional view of the first variation of the first exemplary semiconductor structure of FIG. 11A along line B-B'.
Figure 11C:
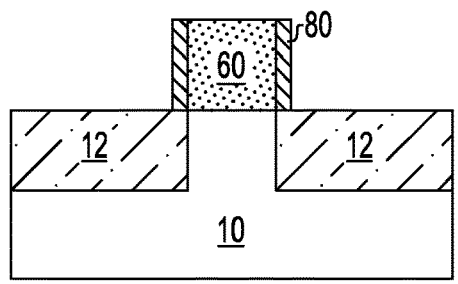
FIG. 11C is a cross-sectional view of the first variation of the first exemplary semiconductor structure of FIG. 11A along line C-C'.

Referring to FIGS. 11A-11C, the channel region 60 is formed in the opening 154 by performing the processing steps of FIGS. 7A-7C. Because the opening 154 is defined by the sacrificial spacer, the growth of the channel region 60 is laterally confined by the sacrificial spacer 80 during the deposition. The original shape of the semiconductor fin 20 is thus preserved.

After formation of the channel region 60, the sacrificial spacer 80 are removed selective to the channel region 60 by an etch, which can be an isotopic etch. In one embodiment, the sacrificial spacer 80 can be removed by a wet etch. For example, if the sacrificial spacer 80 includes silicon nitride, the sacrificial spacer 80 can be removed by a wet etch employing hot phosphoric acid.

Subsequently, the functional gate stack can be formed in the gate cavity 52 to straddle the channel region 60 by performing the processing steps of FIGS. 8A-8C.

Figure 12A:
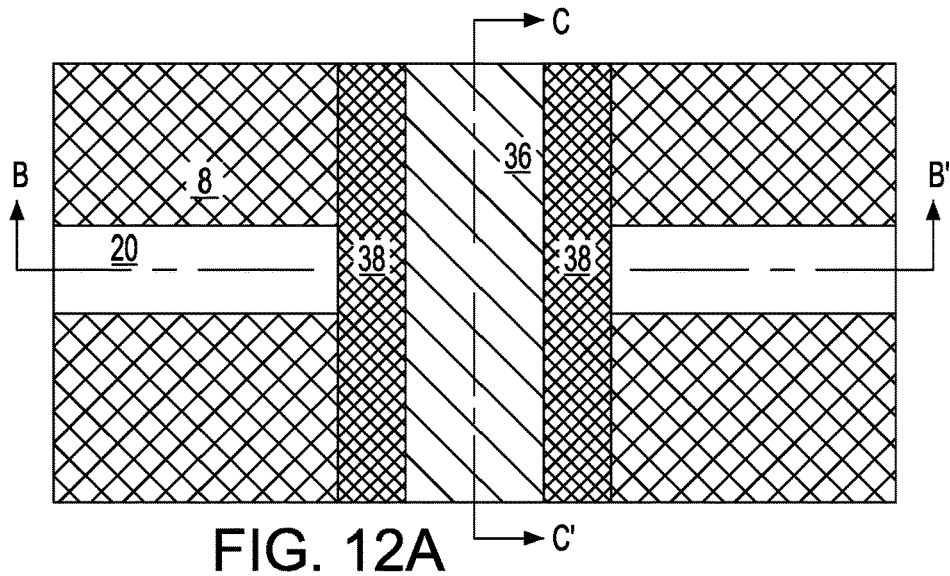
FIG. 12A is a top-down view of a second variation of the first exemplary semiconductor structure in which a semiconductor-on-insulator (SOI) substrate in lieu of a bulk semiconductor substrate is employed to form the semiconductor fin.
Figure 12B:
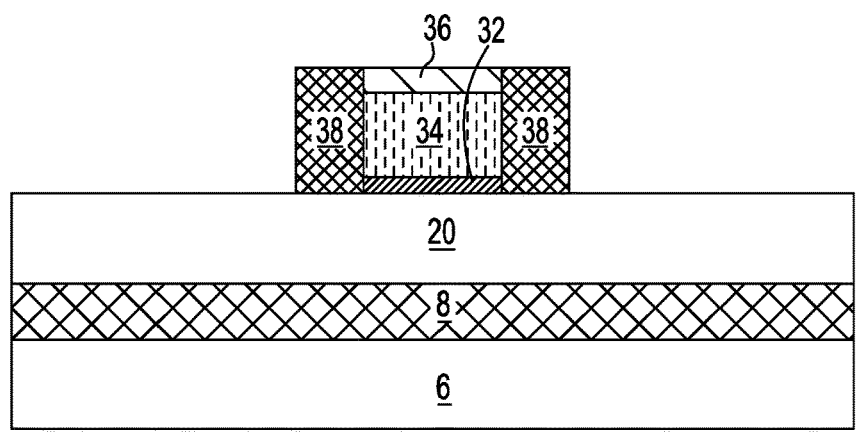
FIG. 12B is a cross-sectional view of the second variation of the first exemplary semiconductor structure of FIG. 12A along line B-B'.
Figure 12C:
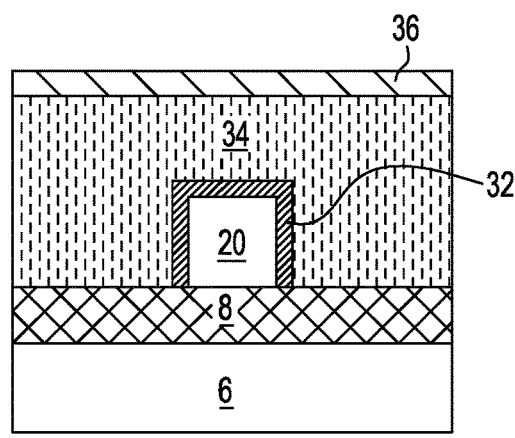
FIG. 12C is a cross-sectional view of the second variation of the first exemplary semiconductor structure of FIG. 12A along line C-C'.

Referring to FIGS. 12A-12C, a second variation of the first exemplary semiconductor structure may employ a semiconductor-on-insulator (SOI) substrate in lieu of a bulk semiconductor substrate to form the semiconductor fin 20. The SOI substrate includes, from bottom to top, a handle substrate 6, a buried insulator layer 8 and a top semiconductor layer (not shown) from which the semiconductor fin 20 is formed.

The handle substrate 6 may include a semiconductor material such as, for example, Si, Ge, SiGe, SiC, SiGeC or an III-V compound semiconductor. The handle substrate provides mechanical support to the buried insulator layer and the top semiconductor layer. The thickness of the handle substrate can be from 30 μm to about 2 mm, although less and greater thicknesses can also be employed.

The buried insulator layer 8 may include a dielectric material such as silicon oxide, silicon nitride, silicon oxynitride, boron nitride or a combination thereof. In one embodiment, the buried insulator layer 8 may be formed by a deposition process, such as chemical vapor deposition (CVD) or physically vapor deposition (PVD). In another embodiment, the buried insulator layer 8 may be formed using a thermal growth process, such as thermal oxidation, to convert a surface portion of the handle substrate. The thickness of the buried insulator layer 8 can be from 50 nm to 200 nm, although lesser or greater thicknesses can also be employed.

The top semiconductor layer may include a semiconductor material such as, for example, Si, Ge, SiGe, SiC, SiGeC, and an III-V compound semiconductor such as, for example, InAs, GaAs or InP. The semiconductor materials of the top semiconductor layer and the handle substrate may be the same or different. Typically, each of the handle substrate and the top semiconductor layer includes a single crystalline semiconductor material, such as, for example, single crystalline silicon.

The top semiconductor layer can be formed by a deposition process, such as CVD or plasma enhanced chemical vapor deposition (PECVD). The top semiconductor layer that is formed may have a thickness from 10 nm to 200 nm, although lesser or greater thicknesses can also be employed. Alternatively, the top semiconductor layer may be formed using a smart cut process where two semiconductor wafers are bonded together with an insulator in between.

The semiconductor fin 20 can be formed by performing lithography and etching processes described above in FIGS. 1A-1C. After forming the semiconductor fin 20, the processing steps of FIGS. 1A-1C can be performed to form the sacrificial gate structure (32, 34, 36, 38) over the semiconductor fin 20.

Figure 13A:
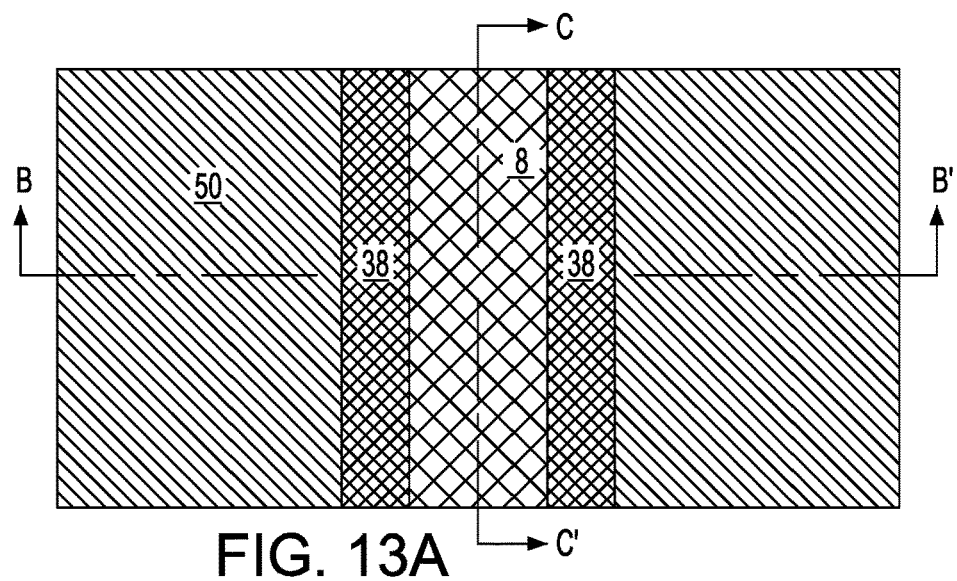
FIG. 13A is a top-down view of the second variation of the first exemplary semiconductor structure of FIGS. 12A-12C after removing the portion of the dopant-containing semiconductor fin exposed by the gate cavity to provide the opening.
Figure 13B:
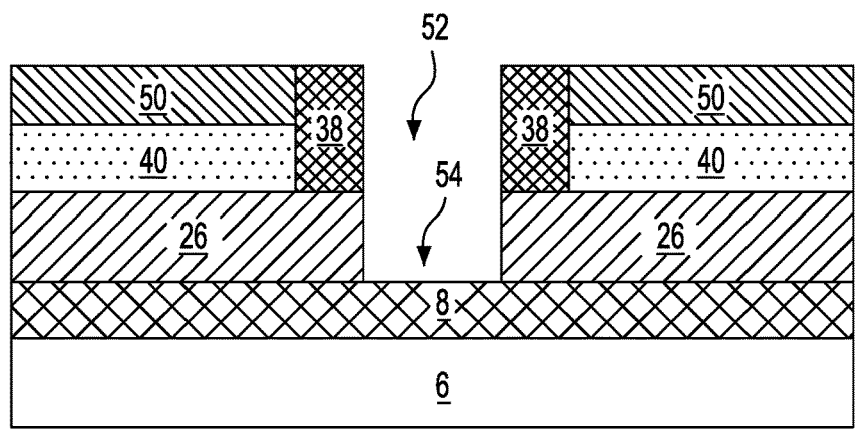
FIG. 13B is a cross-sectional view of the second variation of the first exemplary semiconductor structure of FIG. 13A along line B-B'.
Figure 13C:
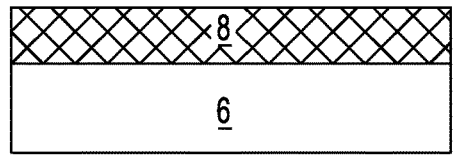
FIG. 13C is a cross-sectional view of the second variation of the first exemplary semiconductor structure of FIG. 13A along line C-C'.

Referring to FIGS. 13A-13C, the processing steps of FIGS. 2A-2C, 3A-3C, 4A-4C, 5A-5C and 6A-6C are sequentially performed to form the epitaxial semiconductor layer 40, the ILD layer 50, the gate cavity 52, the opening 54 and the extension regions 26 laterally surrounding the opening 54. The opening 54 exposes a top surface of the buried insulator layer 8. The sacrificial spacer may be optionally formed before forming the opening 54 and removed in later process.

Figure 14A:
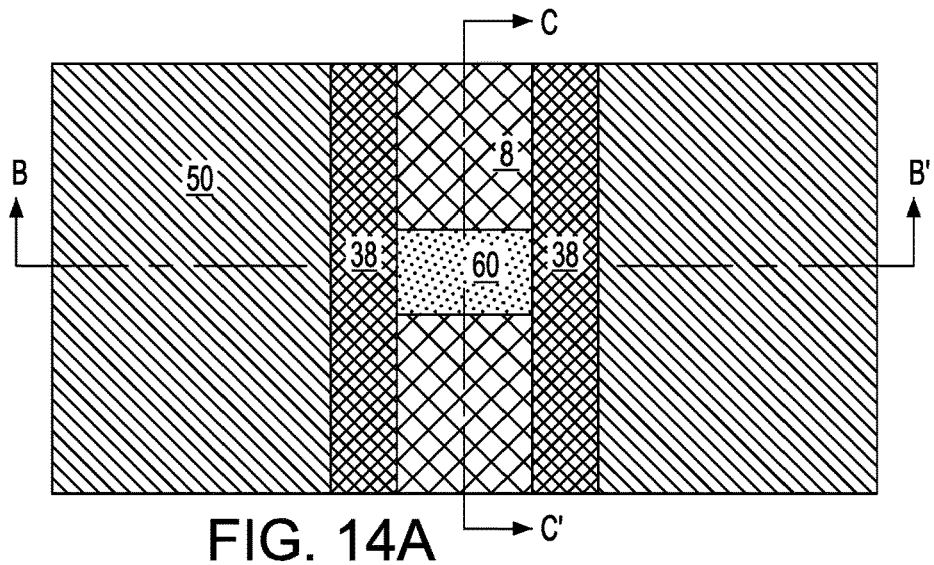
FIG. 14A is a top-down view of the second variation of the first exemplary semiconductor structure of FIGS. 13A-13C after forming the channel region in the opening.
Figure 14B:
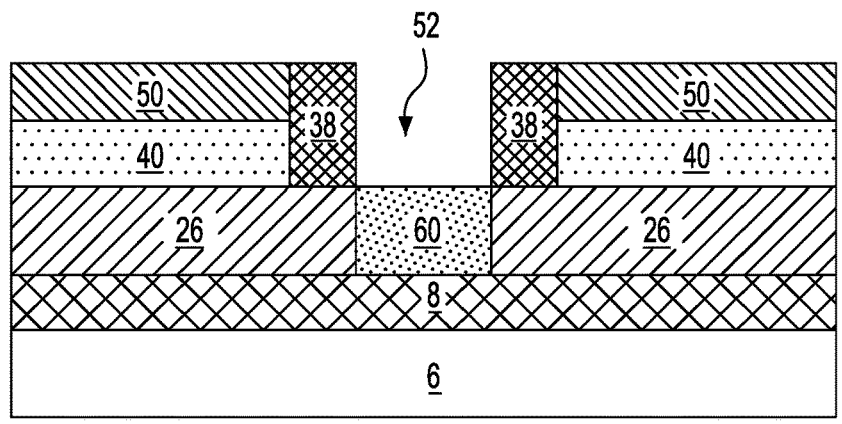
FIG. 14B is a cross-sectional view of the second variation of the first exemplary semiconductor structure of FIG. 14A along line B-B'.
Figure 14C:
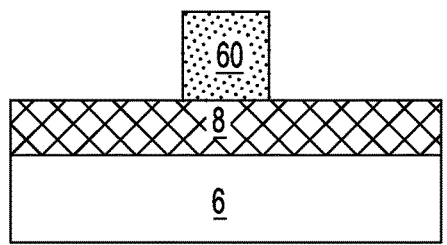
FIG. 14C is a cross-sectional view of the second variation of the first exemplary semiconductor structure of FIG. 14A along line C-C'.

Referring to FIGS. 14A-14C, the processing steps of FIGS. 7A-7B are performed to form the channel region 60 within the opening 54. In this case, the semiconductor material providing the channel region 60 grows only from the exposed sidewall surfaces of the extension regions 26, and does not grown from dielectric surfaces such as the buried insulator layer 8, the gate spacer 38 and the ILD layer 50.

Figure 15A:
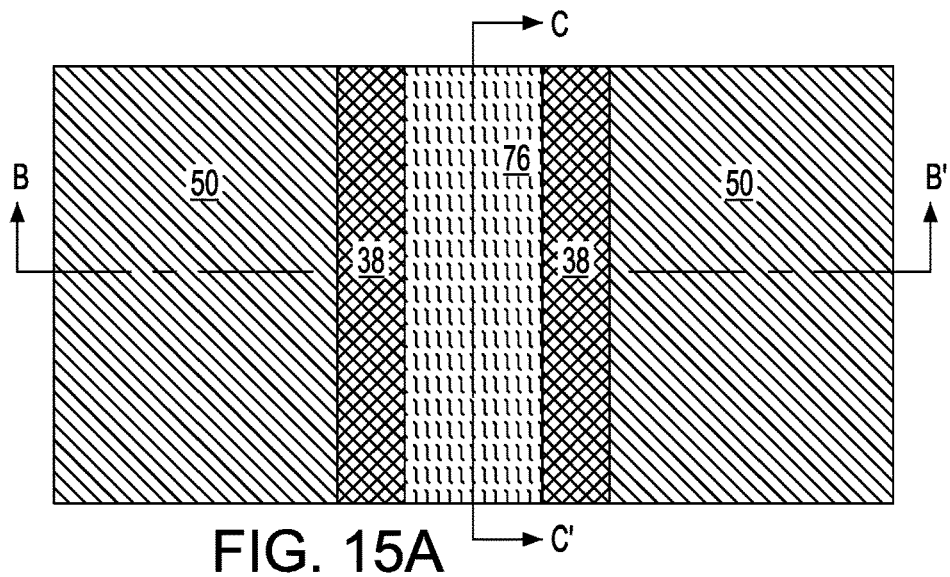
FIG. 15A is a top-down view of the second variation of the first exemplary semiconductor structure of FIGS. 14A-14C after forming the functional gate stack in the gate cavity.
Figure 15B:
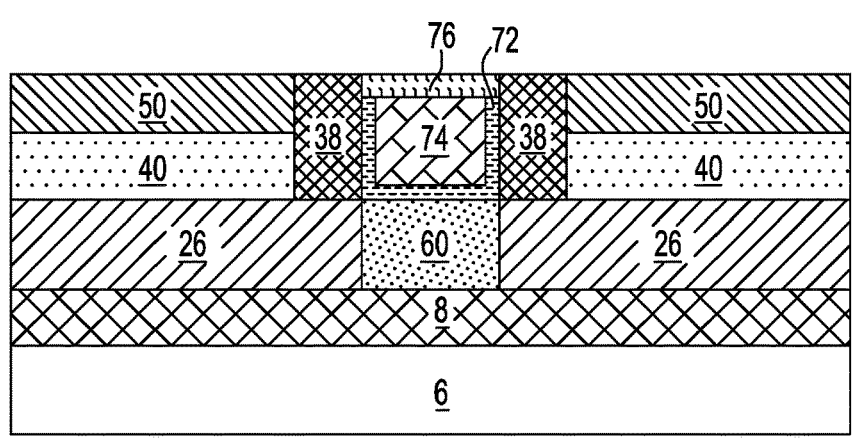
FIG. 15B is a cross-sectional view of the second variation of the first exemplary semiconductor structure of FIG. 15A along line B-B'.
Figure 15C:
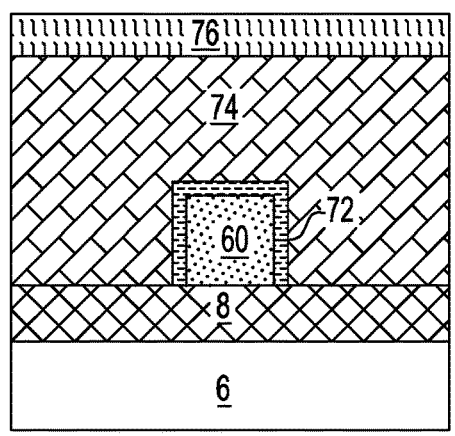
FIG. 15C is a cross-sectional view of the second variation of the first exemplary semiconductor structure of FIG. 15A along line C-C'.

Referring to FIGS. 15A-15C, the processing steps of FIGS. 8A-8C are performed to form the functional gate stack (72, 74, 76) in the gate cavity 52.

Figure 16A:
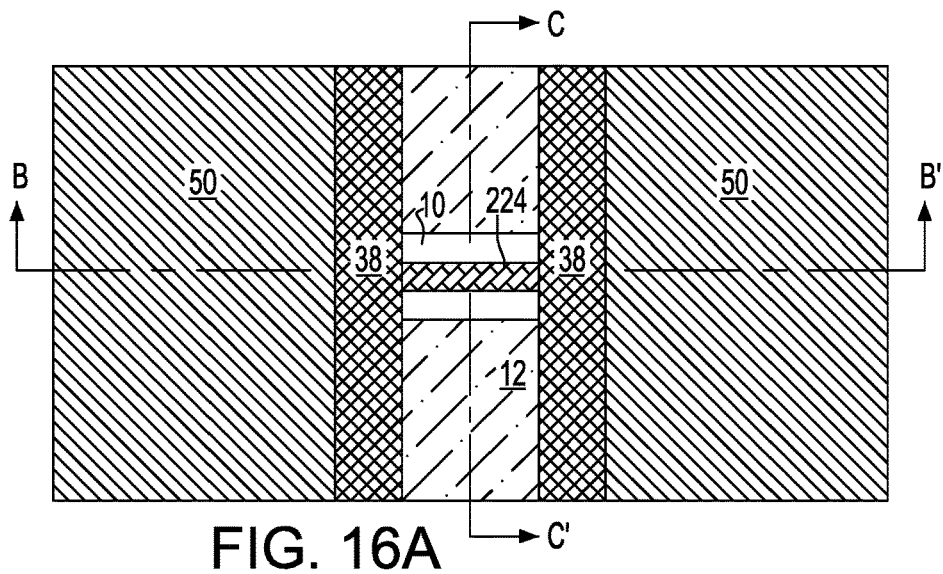
FIG. 16A is a top-down view of a second exemplary semiconductor structure that can be derived from the first exemplary semiconductor structure of FIGS. 5A-5C after removing an outer portion of a portion of the dopant-containing semiconductor fin that is exposed by the gate cavity to provide a template region in an opening located beneath the gate cavity according to a second embodiment of the present application.
Figure 16B:
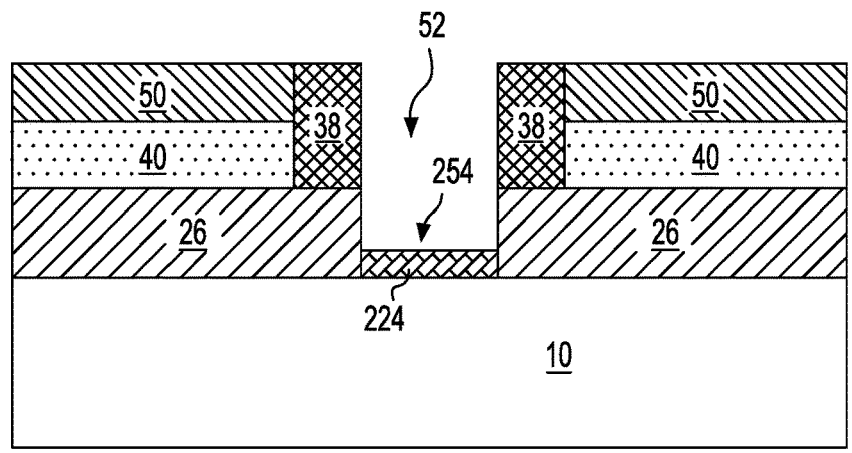
FIG. 16B is a cross-sectional view of the second exemplary semiconductor structure of FIG. 16A along line B-B'.
Figure 16C:
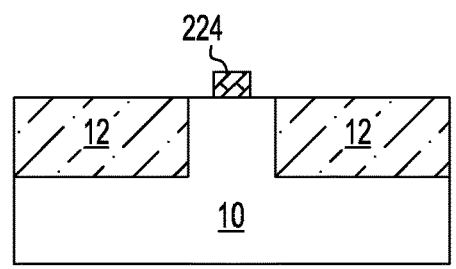
FIG. 16C is a cross-sectional view of the second exemplary semiconductor structure of FIG. 16A along line C-C'.

Referring to FIGS. 16A-16C a second exemplary semiconductor structure according to a second embodiment of the present application can be derived from the first exemplary semiconductor structure of FIGS. 5A-5C after removing an outer portion of a portion of the dopant-containing semiconductor fin 22 that is exposed by the gate cavity 52. The outer portion of the exposed portion of the dopant-containing semiconductor fin 22 is removed by an isotropic etch which can be a dry etch or a wet etch. The removal of the outer portion of the exposed portion of the dopant-containing semiconductor fin 22A also exposes a portion of the semiconductor substrate 10. The remaining interior portion of the exposed portion of the dopant-containing semiconductor fin 22 is the least doped region in the dopant-containing semiconductor fin 22, thus can be employed as a template for epitaxial growth of a semiconductor material in formation of a channel region. The remaining interior portion of the exposed portion of the dopant-containing semiconductor fin 22 is herein referred to as a template region 224. The template region 224 is thinner and shorter than the portions of the dopant-containing semiconductor fin 22 that remain protected by the gate spacer 38 and the ILD layer 50. The remaining portions of the dopant-containing semiconductor fin 22 provide the extension regions 26. The removal of the outer portion of the exposed portion of the dopant-containing semiconductor fin 22 forms an opening 254 underneath the gate cavity 52.

Figure 17A:
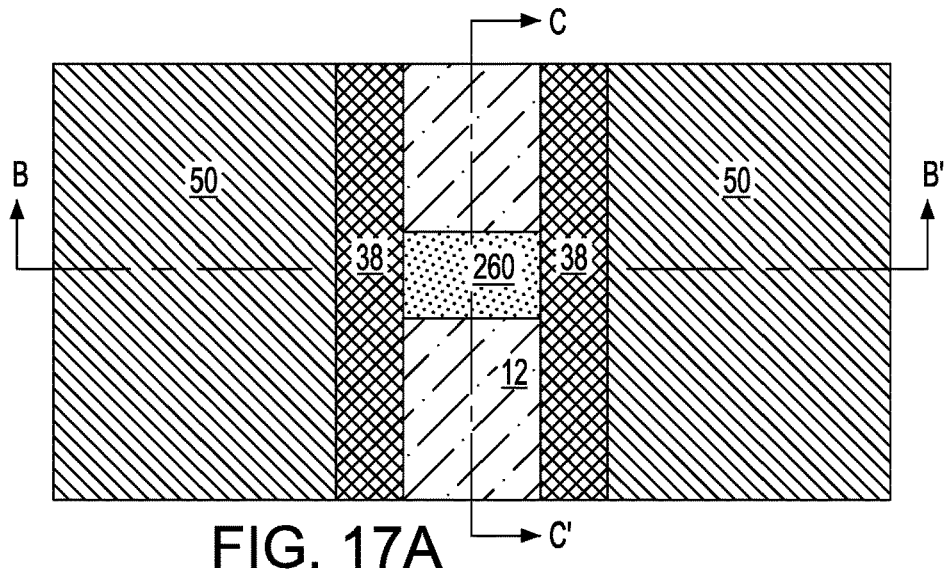
FIG. 17A is a top-down view of the second exemplary semiconductor structure of FIGS. 16A-16C after forming a channel region in the opening.
Figure 17B:
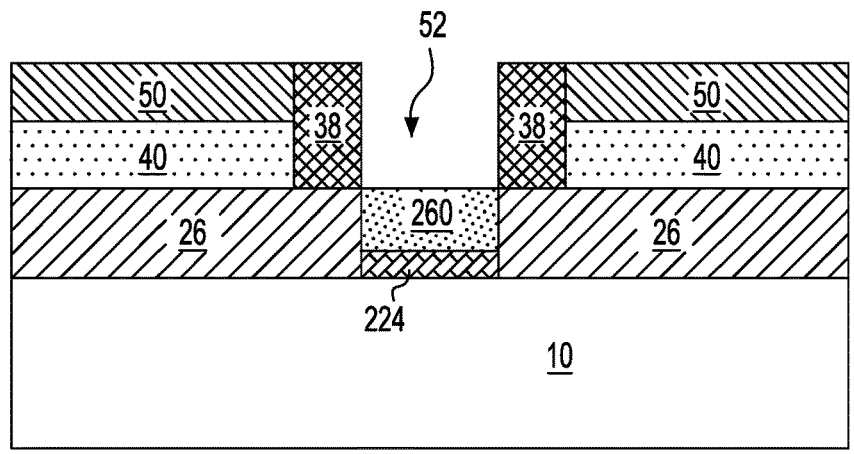
FIG. 17B is a cross-sectional view of the second exemplary semiconductor structure of FIG. 17A along line B-B'.
Figure 17C:
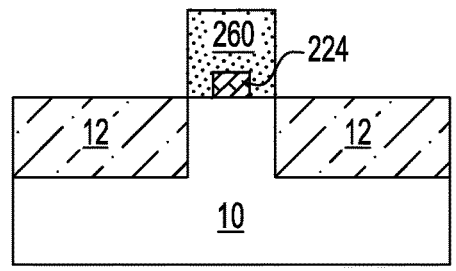
FIG. 17C is a cross-sectional view of the second exemplary semiconductor structure of FIG. 17A along line C-C'.

Referring to FIGS. 17A-17C, a channel region 260 is formed on exposed semiconductor surfaces (i.e., sidewalls of the extension regions 26, the top surface of the semiconductor substrate and the top surface and sidewalls of the template region 224) in the opening 254 by performing processing steps of FIGS. 7A-7C. The channel region 260 may include a semiconductor material the same as, or different from, the semiconductor material of the template region 224. In one embodiment and when the template region 224 is composed of silicon, the channel region 260 can include germanium.

A pair of abrupt junctions is formed at the interfaces between sidewalls of the channel region 260 and the sidewalls of the extension regions 26. The sidewalls of the extension regions 26 are vertically coincident with the inner sidewalls of the gate spacer 38. Abrupt junctions that are self-aligned with a functional gate stack later formed in the gate cavity 52 are thus obtained.

Figure 18A:
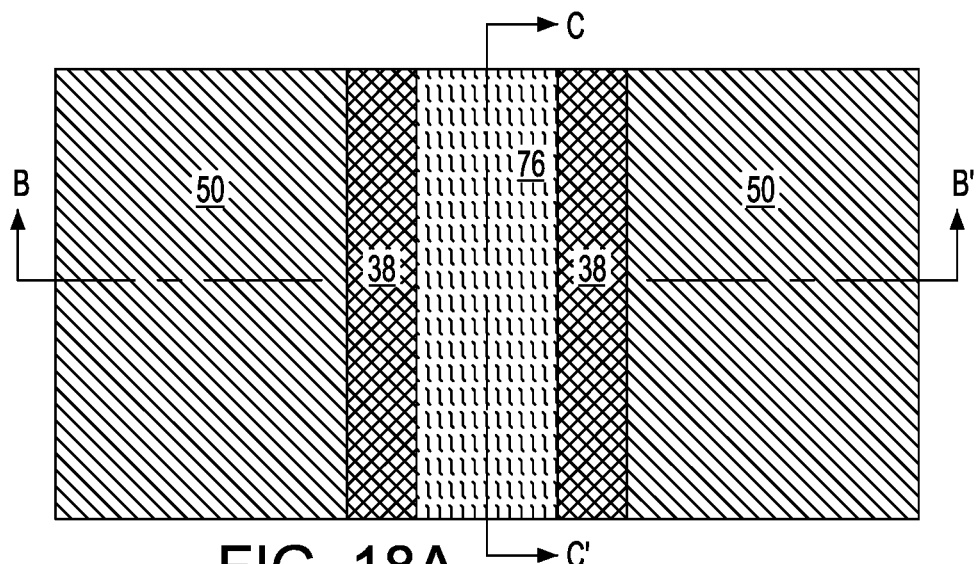
FIG. 18A is a top-down view of the second exemplary semiconductor structure of FIGS. 17A-17C after forming a functional gate stack in the gate cavity.
Figure 18B:
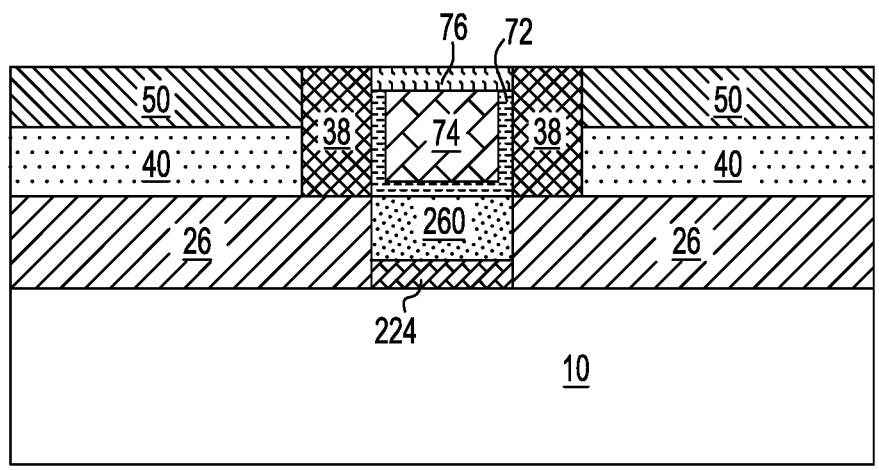
FIG. 18B is a cross-sectional view of the second exemplary semiconductor structure of FIG. 18A along line B-B'.
Figure 18C:
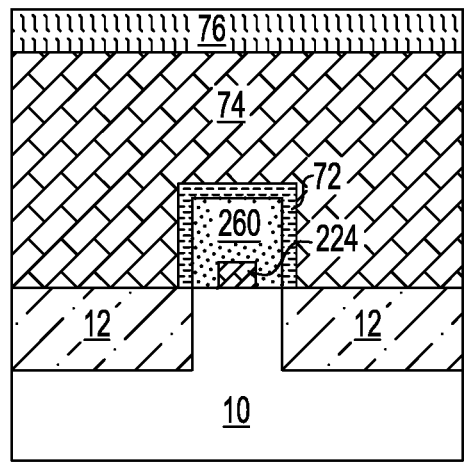
FIG. 18C is a cross-sectional view of the second exemplary semiconductor structure of FIG. 18A along line C-C'.

Referring to FIGS. 18A-18C, a functional gate stack including, from bottom to top, a gate dielectric 72, a gate conductor 74 and a gate cap is formed within the gate cavity 52 by performing processing steps of FIGS. 9A-9C.

Figure 19:
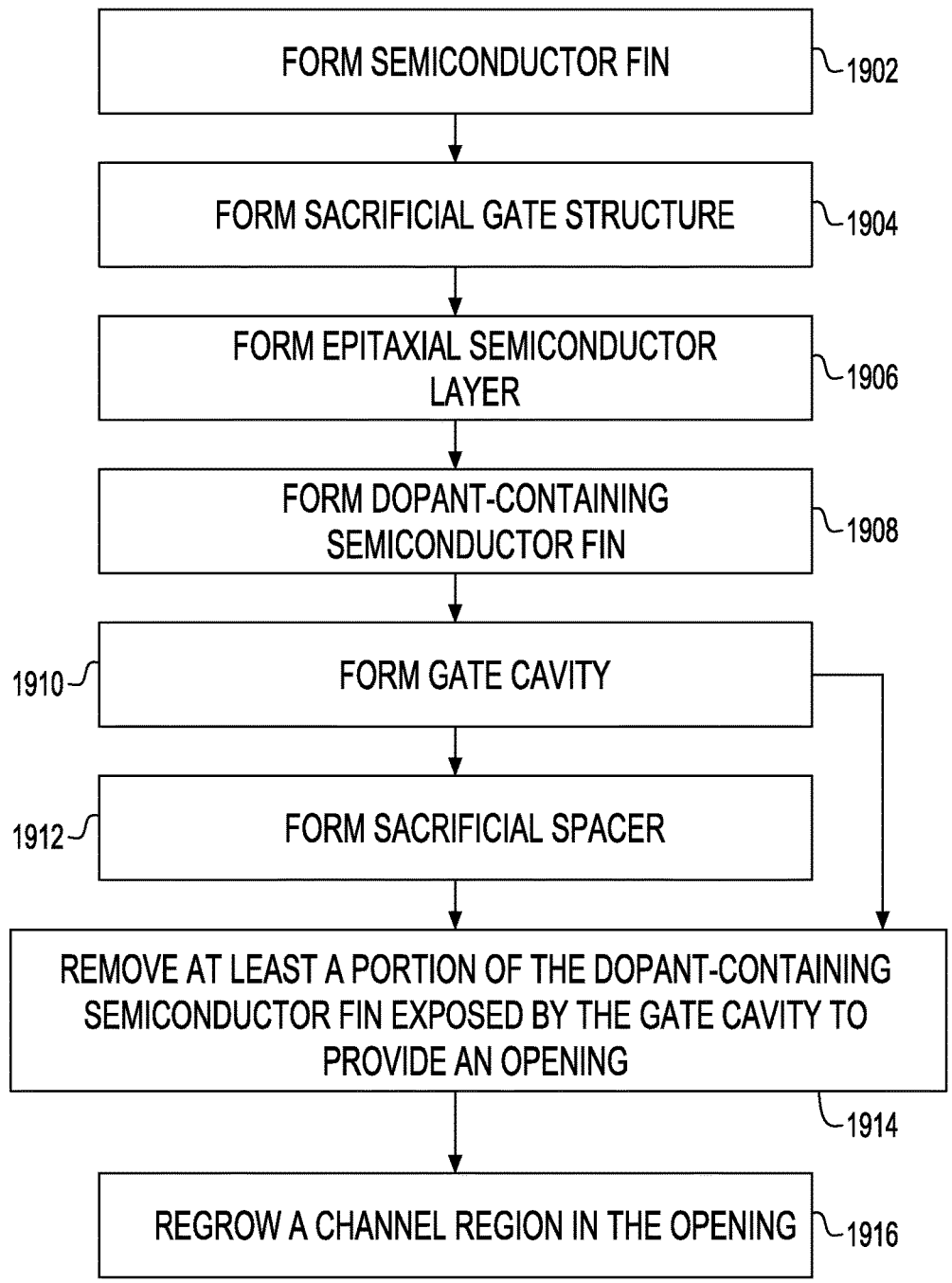
FIG. 19 is a flowchart illustrating methods of forming a FinFET according to embodiments of the present application.

FIG. 19 is a flowchart 1900 illustrating methods of forming a FinFET according to embodiments of the present application. In step 1902, a semiconductor fins is formed. In step 1904, a sacrificial gate structure is formed. In step 1906, an epitaxial semiconductor layer is formed. In step 1908, a dopant-containing semiconductor fin is formed. In step 1910, a gate cavity is formed. In step 1912, a sacrificial spacer is formed on sidewalls of a portion of the dopant-containing semiconductor fin exposed by the gate cavity. In step 1914, the exposed portion of the dopant-containing semiconductor fin is removed to provide an opening underneath the gate cavity. In some embodiments, the step 1914 may follow step 1910 without performing step 1912. In step 1916, a channel region is regrown in the opening.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a source region and a drain region spaced apart from each other and located on a substrate;
   a template region located on the substrate and laterally abutted by the source region and the drain region;
   a channel region wrapping around the template region and laterally abutted by the source region and the drain region; and
   a gate stack wrapping around the channel region, wherein sidewalls of the gate stack are vertically aligned with end walls of the channel region and end walls of the template region.

2. The semiconductor structure of claim 1, wherein each of the template region, the source region and the drain region comprises a first semiconductor material, and the channel region comprises a second semiconductor material.

3. The semiconductor structure of claim 2, wherein the second semiconductor material is the same as the first semiconductor material.

4. The semiconductor structure of claim 2, wherein the second semiconductor material is different from the first semiconductor material.

5. The semiconductor structure of claim 4, wherein each of the template region, the source region and the drain region comprises Si, and the channel region comprises germanium.

6. The semiconductor structure of claim 1, wherein each of the template region, the source region and the drain region comprises first dopants of a first conductivity type.

7. The semiconductor structure of claim 6, wherein the template region has a first dopant concentration, and each of the source region and the drain region has a second dopant concentration that is greater than the first dopant concentration.

8. The semiconductor structure of claim 7, wherein the first dopant concentration is below $1\times10^{19}$ atoms/cm$^3$, and the second dopant concentration is above $1\times10^{19}$ atoms/cm$^3$.

9. The semiconductor structure of claim 6, wherein the template region has a graded dopant concentration such that the dopant concentration decreases gradually towards a center of the template region.

10. The semiconductor structure of claim 6, wherein the channel region is intrinsic.

11. The semiconductor structure of claim 6, wherein the channel region comprises second dopants of a second conductivity type opposite to the first conductivity type.

12. The semiconductor structure of claim 7, further comprising a raised source region present on the source region and a raised region present on the drain region, wherein each of the raise source region and the raised drain region comprises the first dopants of the first conductivity type.

13. The semiconductor structure of claim 12, wherein each of the raised source region and the raised drain region has a third dopant concentration greater than the second dopant concentration of each of the source region and the drain region.

14. The semiconductor structure of claim 12, wherein each of the raised source region and the raised drain region comprises a third semiconductor material the same as, or different from, the first semiconductor material.

15. The semiconductor structure of claim 14, wherein each of the raised source region and the raised drain region comprises silicon, silicon germanium, germanium, silicon-carbon or a compound semiconductor material.

16. The semiconductor structure of claim 1, wherein the top surface of the template region is located below a top surface of each of the source region and the drain region.

17. The semiconductor structure of claim 16, wherein the top surface of the channel region is coplanar with the top surface of each of the source region and the drain region.

18. The semiconductor structure of claim 1, wherein heights of sidewalls of the template region are offset from that of sidewalls of the source region and the drain region.

19. The semiconductor structure of claim 18, wherein sidewalls of the channel region and the sidewalls of each of the source region and the drain region are located within same vertical planes.

20. The semiconductor structure of claim 1, further comprising a gate spacer present on sidewalls of the gate stack, wherein the gate spacer vertically contacts a portion of each of the source region and the drain region adjoined to the channel region.

* * * * *